US011859913B2

United States Patent
Oda et al.

(10) Patent No.: US 11,859,913 B2
(45) Date of Patent: Jan. 2, 2024

(54) WICK SHEET FOR VAPOR CHAMBER, VAPOR CHAMBER, AND ELECTRONIC APPARATUS

(71) Applicant: DAI NIPPON PRINTING CO., LTD., Tokyo-to (JP)

(72) Inventors: Kazunori Oda, Tokyo-to (JP); Toshihiko Takeda, Tokyo-to (JP); Shinichiro Takahashi, Tokyo-to (JP); Takayuki Ota, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/272,179

(22) PCT Filed: Sep. 9, 2020

(86) PCT No.: PCT/JP2020/034182
§ 371 (c)(1),
(2) Date: Feb. 26, 2021

(87) PCT Pub. No.: WO2021/070544
PCT Pub. Date: Apr. 15, 2021

(65) Prior Publication Data
US 2021/0392781 A1    Dec. 16, 2021

(30) Foreign Application Priority Data

Oct. 9, 2019   (JP) .................. 2019-186194
Oct. 9, 2019   (JP) .................. 2019-186221

(51) Int. Cl.
*F28D 15/04*   (2006.01)
*F28D 15/02*   (2006.01)
*H05K 7/20*    (2006.01)

(52) U.S. Cl.
CPC ....... *F28D 15/046* (2013.01); *F28D 15/0233* (2013.01); *F28D 15/0266* (2013.01); *H05K 7/2039* (2013.01); *H05K 7/20336* (2013.01)

(58) Field of Classification Search
CPC .............. F28D 15/046; F28D 15/0266; F28D 15/0233; F28D 15/0275; F28D 15/04; H05K 7/20336; H05K 7/2039
See application file for complete search history.

(56) References Cited

U.S. PATENT DOCUMENTS

2005/0183847 A1* 8/2005 Wong .................. F28D 15/0233
                                                 165/104.33
2007/0022603 A1* 2/2007 Chuang ............... F28D 15/0233
                                                 29/890.032
(Continued)

FOREIGN PATENT DOCUMENTS

JP    2008-082698 A    4/2008
JP    2010-14292 A    1/2010
(Continued)

OTHER PUBLICATIONS

Apr. 12, 2022 English translation of International Preliminary Report on Patentability issued in International Patent Application No. PCT/JP2020/034182.

(Continued)

*Primary Examiner* — Tavia Sullens
*Assistant Examiner* — Khaled Ahmed Ali Al Samiri
(74) *Attorney, Agent, or Firm* — Oliff PLC

(57) ABSTRACT

A wick sheet for a vapor chamber is sandwiched between a first sheet and a second sheet of the vapor chamber that encloses a working fluid. The wick sheet for a vapor chamber includes a sheet body having a first body surface and a second body surface, a penetration space that penetrates the sheet body, a first groove assembly that is disposed on the second body surface and that communicates (Continued)

with the penetration space, and the second groove assembly that is disposed on the first body surface and that communicates with the penetration space. The flow channel cross-sectional area of a second mainstream groove of the second groove assembly is greater than the flow channel cross-sectional area of a first mainstream groove of the first groove assembly.

29 Claims, 17 Drawing Sheets

(56) References Cited

U.S. PATENT DOCUMENTS

2018/0156545 A1* 6/2018 Delano ................ F28D 15/043
2018/0164043 A1* 6/2018 Kurashima ........... F28D 15/046

FOREIGN PATENT DOCUMENTS

| JP | 6433848 B2 | 12/2018 |
|---|---|---|
| JP | 2019-039662 A | 3/2019 |
| JP | 2019-143960 A | 8/2019 |

OTHER PUBLICATIONS

Nov. 10, 2020 Search Report issued in International Patent Application No. PCT/JP2020/034182.

* cited by examiner

WICK SHEET FOR VAPOR CHAMBER, VAPOR CHAMBER, AND ELECTRONIC APPARATUS

TECHNICAL FIELD

The present invention relates to a wick sheet for a vapor chamber, a vapor chamber, and an electronic apparatus.

BACKGROUND ART

An electronic device that generates heat is used in an electronic apparatus, such as a mobile terminal. Examples of an electronic device include a central processing unit (CPU), a light-emitting diode (LED), and a power semiconductor. Examples of a mobile terminal include a portable terminal and a tablet.

The electronic device is cooled by a heat dissipation device, such as a heat pipe (refer to, for example, Patent Literature 1). The demand for thin heat dissipation devices has been increasing in recent years to make an electronic apparatus thinner. Vapor chambers, which are thinner than heat pipes, are being developed as heat dissipation devices. Vapor chambers cool electronic devices by using enclosed working fluid that absorbs and dissipates the heat of the electronic devices.

More specifically, the working liquid in the vapor chamber receives heat from an electronic device at a portion (an evaporation portion) of the vapor chamber in the vicinity of the electronic device. Accordingly, the working fluid evaporates and turns into working vapor. The working vapor is dispersed in a vapor flow channel portion formed in the vapor chamber in a direction away from the evaporation portion and, thus, is cooled. Then, the working vapor condenses and turns into working liquid. The vapor chamber includes a liquid flow channel portion functioning as a capillary structure (also referred to as a "wick"). Accordingly, the working fluid enters the liquid flow channel portion from the vapor flow channel portion. Thereafter, the working fluid flows through the liquid flow channel portion and is delivered toward the evaporation portion. The working fluid delivered to the evaporation portion receives heat in the evaporation portion and evaporates again. In this way, the working fluid refluxes in the vapor chamber while repeating the phase change, that is, evaporation and condensation. As described above, the working fluid dissipates the heat of the electronic device. As a result, the heat dissipation efficiency of the vapor chamber is increased.

[Patent Literature 1]
Japanese Patent Laid-Open No. 2008-82698

DISCLOSURE OF THE INVENTION

The present invention provides a wick sheet for a vapor chamber, a vapor chamber, and an electronic apparatus capable of reducing a decrease in the performance.

According to a first solution to the problem, the present invention provides a wick sheet for a vapor chamber. The wick sheet is sandwiched between a first sheet and a second sheet of the vapor chamber where a working fluid is enclosed. The wick sheet includes a sheet body having a first body surface and a second body surface provided on the opposite side from the first body surface, a penetration space that penetrates the sheet body, a first groove assembly that is provided on the second body surface and that communicates with the penetration space, and a second groove assembly that is provided on the first body surface and that communicates with the penetration space. The first groove assembly includes a plurality of first mainstream grooves that extend in a first direction. The second groove assembly includes a plurality of second mainstream grooves that extend in the first direction, and the flow channel cross-sectional area of the second mainstream grooves is greater than a flow channel cross-sectional area of the first mainstream grooves.

In the wick sheet for a vapor chamber according to the first solution described above, the width of the second mainstream groove may be greater than the width of the first mainstream groove.

In addition, in the wick sheet for a vapor chamber according to the first solution above, the depth of the second mainstream groove may be greater than the depth of the first mainstream groove.

In addition, in the wick sheet for a vapor chamber according to the first solution described above, the sheet body may include a plurality of land portions that partition the penetration space into a plurality of passages. The land portions may be spaced apart from each other in a second direction that is orthogonal to the first direction, and a width of the second mainstream groove may be less than a gap between a pair of the land portions neighboring each other.

In addition, in the wick sheet for a vapor chamber according to the first solution described above, the sheet body may include a plurality of land portions that partition the penetration space into a plurality of passages. The first groove assembly and the second groove assembly may be provided in at least one of the land portions, and the number of the second mainstream grooves provided in the land portion may be less than the number of the first mainstream grooves provided in the land portion.

In addition, in the wick sheet for a vapor chamber according to the first solution described above, the sheet body may include a plurality of land portions that extend in the first direction and that partition the penetration space into a plurality of passages, and the second groove assembly may be disposed on one side of the land portions in the first direction.

In addition, in the wick sheet for a vapor chamber according to the first solution described above, the sheet body may include a plurality of land portions that partition the penetration space into a plurality of passages. Two of the second groove assemblies that neighbor each other in a second direction orthogonal to the first direction may be provided in a pair of the land portions that neighbor each other in the second direction, and the length in the first direction of the second mainstream groove of the second groove assembly provided in one of the land portions may be greater than the length in the first direction of the second mainstream groove of the second groove assembly provided in the other of the land portions.

In addition, in the wick sheet for a vapor chamber according to the first solution described above, the sheet body may include a plurality of land portions that partition the penetration space into a plurality of passages, and a plurality of the second groove assemblies are provided in at least one of the land portions.

In addition, the wick sheet for a vapor chamber according to the first solution described above may include a communication portion provided in the sheet body, and the communication portion may communicate with the first groove assembly and the second groove assembly.

In addition, in the wick sheet for a vapor chamber according to the first solution described above, the communication portion may include a communication recess that is provided on a wall surface of the penetration space and that extends from the first groove assembly to the second groove assembly.

In addition, in the wick sheet for a vapor chamber according to the first solution described above, the first groove assembly may include a first communication groove that extends in a direction different from the first direction and that communicates with the first mainstream groove. The second groove assembly may include a second communication groove that extends in a direction different from the first direction and that communicates with the second mainstream groove, and the communication recess may extend to at least one of the first communication groove and the second communication groove.

In addition, in the wick sheet for a vapor chamber according to the first solution described above, the communication portion may include a through-hole that penetrates the sheet body and that extends from the first groove assembly to the second groove assembly.

In addition, in the wick sheet for a vapor chamber according to the first solution described above, the first groove assembly may include a first communication groove that extends in a direction different from the first direction and that communicates with the first mainstream groove. The first mainstream groove may include a first intersection portion that communicates with the first communication groove. The second groove assembly may include a second communication groove that extends in a direction different from the first direction and that communicates with the first communication groove. The second mainstream groove may include a second intersection portion that communicates with the second communication groove, and the through-hole may extend to at least one of the first intersection portion and the second intersection portion.

According to a second solution, the present invention provides a vapor chamber including a first sheet, a second sheet, and the wick sheet for a vapor chamber according to the first solution described above. The wick sheet is sandwiched between the first sheet and the second sheet.

According to a third solution, the present invention provides an electronic apparatus including a housing, an electronic device housed in the housing, and the vapor chamber according to the second solution described above. The vapor chamber is in thermal contact with the electronic device.

In the electronic apparatus according to the third solution described above, the second groove assembly may be disposed in a region that is different from a region that overlaps the electronic device in plan view of the vapor chamber.

In addition, in the vapor chamber according to the second solution described above, the working fluid may have freezing-expansion property.

According to a fourth solution, the present invention provides an electronic apparatus including a housing, an electronic device housed in the housing, and the vapor chamber according to the second solution described above. The vapor chamber is in thermal contact with the electronic device.

In the electronic apparatus according to the fourth solution described above, the second groove assembly may be disposed in a region that overlaps the electronic device in plan view of the vapor chamber.

In addition, in the electronic apparatus according to the fourth solution described above, the second groove assembly may extend to the outside of the electronic device in the first direction.

In addition, in the electronic apparatus according to the fourth solution described above, the sheet body may include a first overlapped land portion and a second overlapped land portion that partition the penetration space into a plurality of passages. The first overlapped land portion and the second overlapped land portion may be spaced apart from each other in a second direction that is orthogonal to the first direction. The second groove assembly may be provided in the first overlapped land portion and the second overlapped land portion. The second groove assembly provided in the first overlapped land portion and the second groove assembly provided in the second overlapped land portion may be disposed in a region that overlaps the electronic device in plan view of the vapor chamber. The second groove assembly provided in the first overlapped land portion may be located closer to the center of the electronic device than the second groove assembly provided in the second overlapped land portion in the second direction that is orthogonal to the first direction in plan view of the vapor chamber, and the length of the second groove assembly provided in the first overlapped land portion in the first direction may be greater than the length of the second groove assembly provided in the second overlapped land portion in the first direction.

In addition, in the electronic apparatus according to the fourth solution described above, the sheet body may include an overlapped land portion and a non-overlapped land portion that partition the penetration space into a plurality of passages. The overlapped land portion and the non-overlapped land portion may be spaced apart from each other and neighbor each other in a second direction that is orthogonal to the first direction. The second groove assembly may be provided in the overlapped land portion and the non-overlapped land portion. The second groove assembly provided in the overlapped land portion may be disposed in a region that overlaps the electronic device in plan view of the vapor chamber, and the second groove assembly provided in the non-overlapped land portion may be disposed in a region that differs from the region that overlaps the electronic device in plan view of the vapor chamber.

In addition, in the electronic apparatus according to the fourth solution described above, the length of the second groove assembly provided in the overlapped land portion in the first direction may be greater than the length of the second groove assembly provided in the non-overlapped land portion in the first direction.

According to a fifth solution, the present invention provides a vapor chamber including a first sheet, a second sheet, and the wick sheet for a vapor chamber according to the first solution above sandwiched between the first sheet and the second sheet. The working fluid has freezing-expansion property.

According to a sixth solution, the present invention provides an electronic apparatus including a housing, a plurality of electronic devices housed in the housing, and the vapor chamber according to the fifth solution that is in thermal contact with the electronic devices. The electronic devices are disposed in regions that are different from each other in the first direction. A plurality of the second groove assemblies each corresponding to one of the electronic devices are provided on the first body surface, and the second groove assembly is disposed in a region that overlaps the corresponding electronic devices in plan view of the vapor chamber.

According to a seventh solution, the present invention provides a wick sheet for a vapor chamber. The wick sheet is sandwiched between a first sheet and a second sheet of the vapor chamber where a working fluid is enclosed. The wick sheet includes a sheet body having a first body surface and a second body surface provided on the opposite side from the first body surface, a vapor flow channel portion which penetrates the sheet body from the first body surface to the second body surface and through which vapor of the working fluid passes, a liquid flow channel portion that is provided on the second body surface and that communicates with the vapor flow channel portion so that liquid of the working fluid passes through the liquid flow channel portion, and a liquid storage portion that is provided on the first body surface and that communicates with the vapor flow channel portion so that the liquid of the working fluid is stored in the liquid storage portion.

In the wick sheet for a vapor chamber according to the seventh solution described above, the liquid flow channel portion may have a plurality of liquid flow channel mainstream grooves through which the liquid of the working fluid passes. In the liquid storage portion, a plurality of liquid storage protrusion portions that protrude from the sheet body so as to be in contact with the first sheet may be provided. A gap between a pair of the liquid storage protrusion portions neighboring each other may be greater than the width of the liquid flow channel mainstream groove.

In addition, in the wick sheet for a vapor chamber according to the seventh solution described above, the liquid flow channel portion may have a plurality of liquid flow channel mainstream grooves which extend in a first direction and through which the liquid of the working fluid passes. The liquid storage portion may have a plurality of liquid storage mainstream grooves each disposed between two neighboring liquid storage protrusion portions in a second direction that is orthogonal to the first direction and each extending in the first direction.

In addition, in the wick sheet for a vapor chamber according to the seventh solution described above, the sheet body may include a plurality of land portions that partition the vapor flow channel portion into a plurality of vapor passages, and the gap between a pair of the liquid storage protrusion portions neighboring each other may be less than the gap between land portions neighboring each other.

In addition, in the wick sheet for a vapor chamber according to the seventh solution described above, the sheet body may have a plurality of land portions that partition the vapor flow channel portion into a plurality of vapor passages, and the liquid storage portion may be provided in each of the land portions.

In addition, in the wick sheet for a vapor chamber according to the seventh solution described above, the sheet body has a plurality of land portions that extend in the first direction and that partition the vapor flow channel portion into a plurality of vapor passages, and the liquid storage portion may be disposed on one side of the land portion in the first direction.

In addition, the wick sheet for a vapor chamber according to the seventh solution described above may further include a communication portion that is provided in the sheet body and that communicates with the liquid flow channel portion and the liquid storage portion.

In addition, in the wick sheet for a vapor chamber according to the seventh solution described above, the communication portion may include a communication recess provided in the wall surface of the vapor flow channel portion, and the communication recess may extend from the liquid flow channel portion to the liquid storage portion.

In addition, in the wick sheet for a vapor chamber according to the seventh solution described above, the liquid flow channel portion may include a plurality of liquid flow channel mainstream grooves which extend in the first direction and through which the liquid of the working fluid passes and a liquid flow channel communication groove that extends in a direction different from the first direction and that communicates with the liquid flow channel mainstream groove. The liquid storage portion may have a plurality of liquid storage mainstream grooves that extend in the first direction and a liquid storage communication groove that extends in a direction different from the first direction and that communicates with the liquid storage mainstream groove, and the communication recess may extend to at least one of the liquid flow channel communication groove and the liquid storage communication groove.

In addition, in the wick sheet for a vapor chamber according to the seventh solution described above, the communication portion may include a through-hole that penetrates the sheet body and that extends from the liquid flow channel portion to the liquid storage portion.

In addition, in the wick sheet for a vapor chamber according to the seventh solution described above, the liquid flow channel portion may have a plurality of liquid flow channel mainstream grooves which extend in the first direction and through which liquid of the working fluid passes and a liquid flow channel communication groove that extends in a direction different from the first direction and that communicates with the liquid flow channel mainstream groove. The liquid flow channel mainstream groove may further include a liquid flow channel intersection portion that communicates with the liquid flow channel communication groove. The liquid storage portion may include a plurality of liquid storage mainstream grooves that extend in the first direction and a liquid storage communication groove that extends in a direction different from the first direction and that communicates with the liquid storage mainstream grooves. The liquid storage mainstream groove may further include a liquid storage intersection portion that communicates with the liquid storage communication groove, and the through-hole may extend to at least one of the liquid flow channel intersection portion and the liquid storage intersection portion.

According to an eighth solution, the present invention provides a vapor chamber including a first sheet, a second sheet, and the wick sheet for a vapor chamber according to the seventh solution described above. The wick sheet is sandwiched between the first sheet and the second sheet.

Note that the vapor chamber according to the eighth solution described above may have an evaporation region in which the working fluid evaporates, and the liquid storage portion may be disposed in a region different from the evaporation region.

In addition, in the vapor chamber according to the eighth solution described above, the working fluid may have freezing-expansion property.

In addition, the vapor chamber according to the eighth solution described above may have an evaporation region in which the working fluid evaporates, and the liquid storage portion may be disposed in the evaporation region.

According to a ninth solution, the present invention provides an electronic apparatus including a housing, an electronic device housed in the housing, and the vapor chamber according to the eighth solution described above. The vapor chamber is in thermal contact with electronic device.

Advantageous Effects of Invention

According to the present invention, a decrease in the performance can be reduced.

DESCRIPTION OF EMBODIMENTS

Figure 1:
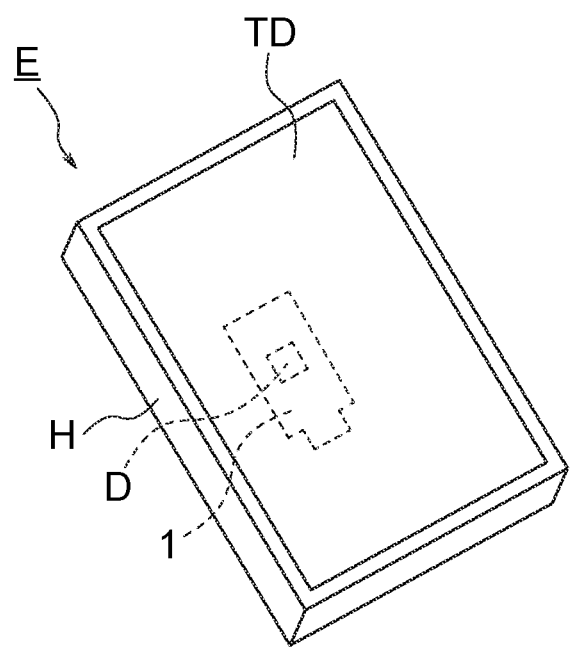
FIG. 1 is a schematic perspective view of an electronic apparatus according to a first embodiment of the present invention.

Embodiments of the present invention are described below with reference to the accompanying drawings. Note that in the drawings attached hereto, for ease of illustration and understanding, the scale, the aspect ratio, and the like are changed from the actual ones and are exaggerated as appropriate.

As used herein, the geometrical conditions, physical properties, the terms identifying the degrees of the geometrical conditions or physical properties, and numerical values indicating the geometrical conditions or physical properties are not defined strictly. Accordingly, these geometric conditions, physical properties, terms, and numerical values shall be interpreted to include the extent to which similar functions can be expected. Examples of a term that identifies geometric conditions include "length", "angle", "shape", and "arrangement". Examples of a term that identifies geometric conditions include "parallel", "orthogonal", and "identical". In addition, for clarity of the drawings, the shapes of a plurality of portions that could be expected to function in a similar manner are illustrated regularly. However, the shapes need not be defined strictly, and the shapes of the portions may differ from one another as long as the portions function as expected. Furthermore, in the drawings, a boundary line indicating the joint surfaces of members and the like are denoted by a straight line for simplicity, but it is not limited to a strict straight line, and any shape of the boundary line may be employed as long as the joint surfaces provide the expected joint performance.

First Embodiment

A wick sheet for a vapor chamber, a vapor chamber, and an electronic apparatus according to the first embodiment of the present invention are described below with reference to FIGS. 1 to 21. A vapor chamber 1 in the present embodiment is housed in a housing H of an electronic apparatus E together with an electronic device D that generates heat. The vapor chamber 1 is a device for cooling the electronic device D. An example of the electronic apparatus E is a mobile terminal, such as a portable terminal or a tablet. Examples of the electronic device D include a central processing unit (CPU), a light emitting diode (LED), and a power semiconductor. The electronic device D is also referred to as a "device to be cooled".

The electronic apparatus E including the vapor chamber 1 according to the present embodiment is described first with reference to a tablet as an example. As illustrated in FIG. 1, the electronic apparatus E includes the housing H and the electronic device D and a vapor chamber 1 housed in the housing H. The electronic apparatus E illustrated in FIG. 1 is provided with a touch panel display TD on the front surface of the housing H. The vapor chamber 1 is housed in the housing H and is disposed so as to be in thermal contact with the electronic device D. This allows the vapor chamber 1 to receive the heat generated by the electronic device D when the electronic apparatus E is in use. The heat received by the vapor chamber 1 is dissipated to the outside of the vapor chamber 1 via working fluids 2a and 2b (described below). In this manner, the electronic device D is effectively cooled. If the electronic apparatus E is a tablet, the electronic device D corresponds to the central processing unit or the like.

Figure 2:
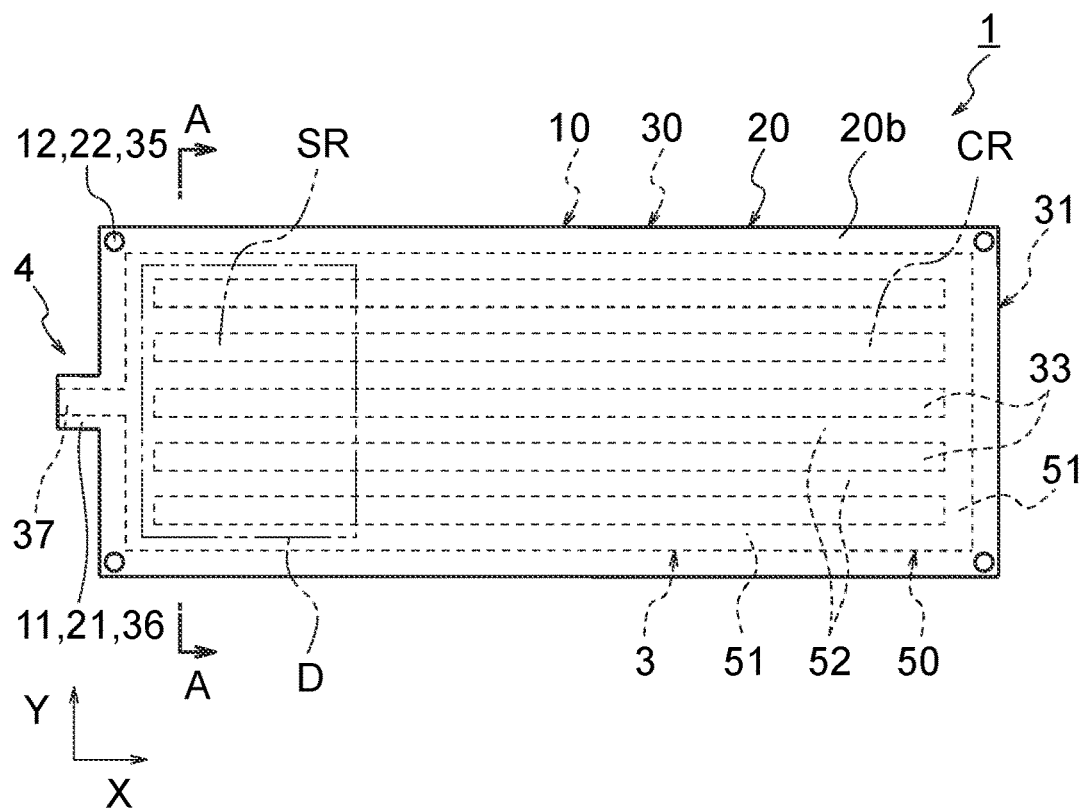
FIG. 2 is a top view of a vapor chamber according to the first embodiment of the present invention.
Figure 3:
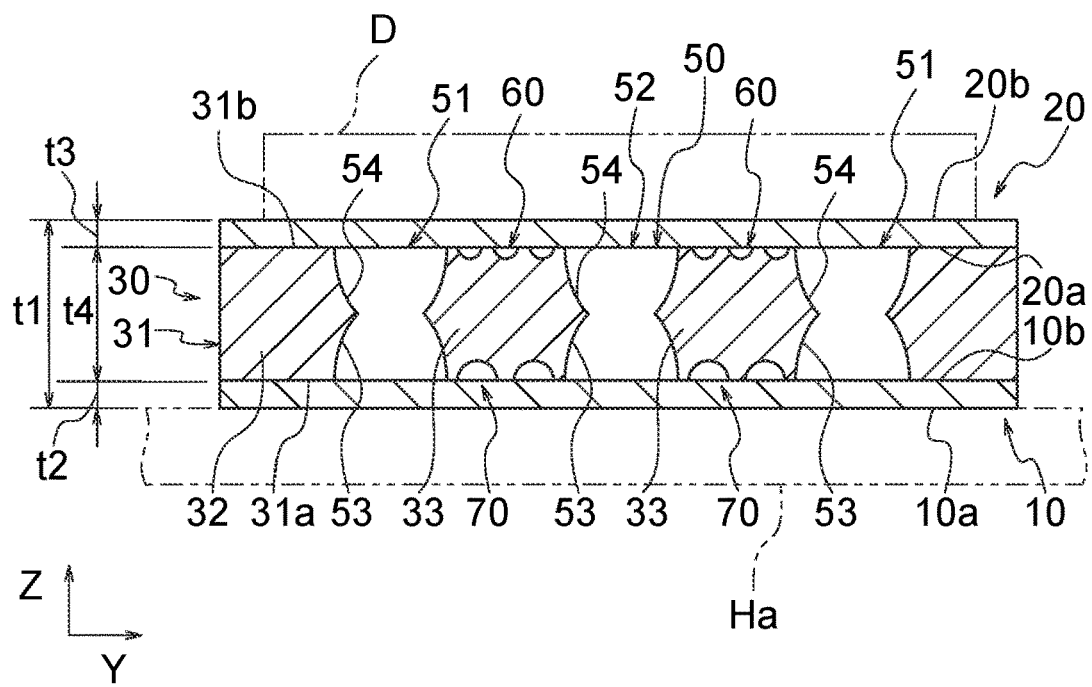
FIG. 3 is a sectional view of the vapor chamber taken along line A-A of FIG. 2.

The vapor chamber 1 according to the present embodiment is described below. As illustrated in FIGS. 2 and 3, the vapor chamber 1 has a sealed space 3 in which the working fluids 2a and 2b are enclosed, and the phase changes of the working fluids 2a and 2b in the sealed space 3 are repeated. Thus, the electronic device D described above is cooled. Examples of the working fluids 2a and 2b include pure water, ethanol, methanol, acetone, and any mixture thereof. Note that the working fluids 2a and 2b may have freezing-expansion property. That is, the working fluids 2a and 2b may be fluids that exhibit expansion upon freezing. Examples of the working fluids 2a and 2b that exhibit expansion upon freezing include pure water and an aqueous solution of pure water and an additive, such as alcohol.

As illustrated in FIGS. 2 and 3, the vapor chamber 1 has a lower sheet 10, an upper sheet 20, and a wick sheet 30 for a vapor chamber. The lower sheet 10 is an example of a first sheet. The upper sheet 20 is an example of a second sheet. The wick sheet 30 for a vapor chamber is sandwiched between the lower sheet 10 and the upper sheet 20. Hereinafter, the wick sheet for a vapor chamber is simply referred to as a wick sheet 30. In the present embodiment, the lower sheet 10, the wick sheet 30, and the upper sheet 20 are stacked in this order.

The vapor chamber 1 is formed in the shape of a substantially thin, flat plate. The vapor chamber 1 may have any planar shape, and the planar shape of the vapor chamber 1 may be rectangular as illustrated in FIG. 2. For example, the planar shape of the vapor chamber 1 may be a rectangle with one side of length 1 cm and adjacent side of length 3 cm, or a square with side 15 cm on one side. The vapor chamber 1 may have any planar dimensions. The present embodiment is described below with reference to the vapor chamber 1 having a rectangular planar shape with the longitudinal direction being a X direction (described below). In this case, as illustrated in FIGS. 4 to 7, the lower sheet 10, upper sheet 20, and wick sheet 30 may have the same planar shape as the vapor chamber 1. Note that the planar shape of the vapor chamber 1 is not limited to a rectangle but instead may be any shape, such as a circle, an ellipse, L shape, or T shape.

As illustrated in FIG. 2, the vapor chamber 1 has an evaporation region SR in which the working fluids 2a and 2b evaporate and a condensation region CR in which the working fluids 2a and 2b condense.

The evaporation region SR overlaps the electronic device D in plan view and is the region where the electronic device D is attached. The evaporation region SR can be disposed anywhere in the vapor chamber 1. In the present embodiment, the evaporation region SR is formed on one side of the vapor chamber 1 in the X direction (the left side in FIG. 2). Heat is transferred from the electronic device D to the evaporation region SR, and the heat causes the liquid of the working fluid to evaporate in the evaporation region SR. The heat from the electronic device D may be transferred not only to the region that overlaps the electronic device D in plan view, but also to a region around the region where the electronic device D overlaps. Accordingly, the evaporation region SR includes the region that overlaps the electronic device D and a region that surrounds the region in plan view. As used herein, the term "plan view" is referred to the view in the direction orthogonal to a surface of the vapor chamber 1 that receives heat from the electronic device D and a surface that dissipates the received heat. The surface that receives heat corresponds to a second upper sheet surface 20b of the upper sheet 20 (described below). The surface that dissipates heat corresponds to a first lower sheet surface 10a of the lower sheet 10 (described below). For example, as illustrated in FIG. 2, the view of the vapor chamber 1 viewed from above or from below corresponds to the plan view. Note that the vapor of the working fluid is referred to as "working vapor 2a", and the liquid of the working fluid is referred to as "working liquid 2b".

The condensation region CR is a region that does not overlap the electronic device D in plan view and is a region in which mainly the working vapor 2a dissipates heat and condenses. The condensation region CR can be referred to as a region surrounding the evaporation region SR. In the condensation region CR, the heat from the working vapor 2a is dissipated to the lower sheet 10, and the working vapor 2a is cooled and condenses in the condensation region CR.

When the vapor chamber 1 is mounted inside a tablet, the top-bottom relationship may be changed depending on the posture of the tablet. However, in the present embodiment, for convenience, the sheet that receives heat from the electronic device D is referred to as the upper sheet 20 described above, and the sheet that dissipates the received heat is referred to as the lower sheet 10 described above. Thus, the configuration of the vapor chamber 1 is described with reference to the lower sheet 10 disposed on the lower side and the upper sheet 20 disposed on the upper side.

Figure 4:
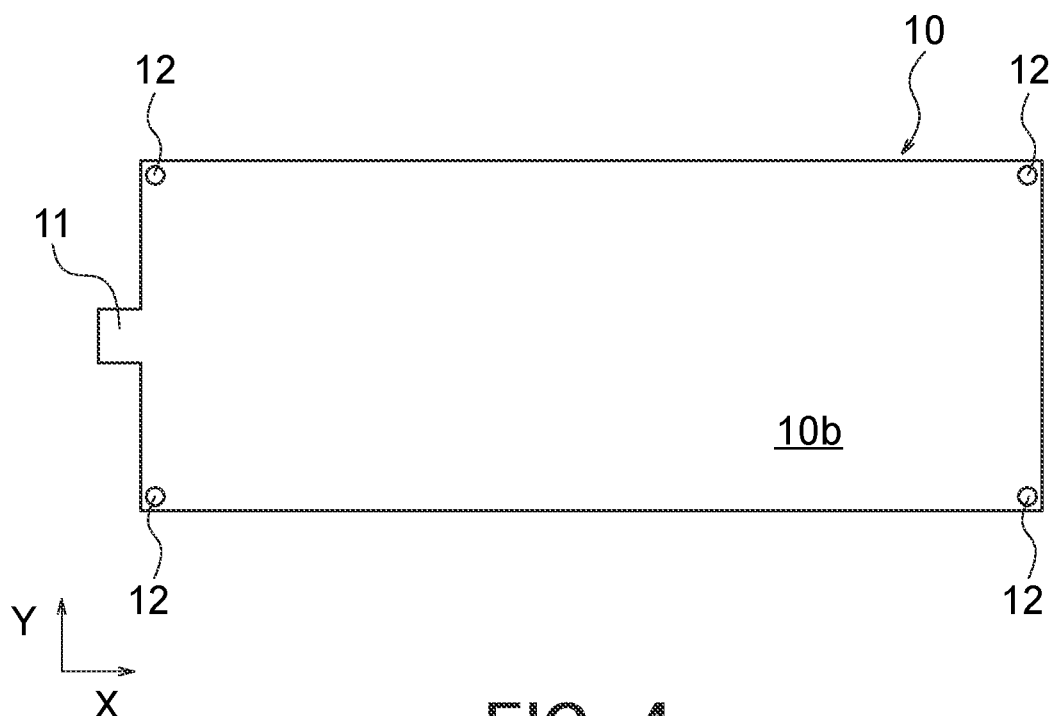
FIG. 4 is a top view of a lower sheet illustrated in FIG. 3.

As illustrated in FIG. 3, the lower sheet 10 has the first lower sheet surface 10a provided on the opposite side from the wick sheet 30 and a second lower sheet surface 10b provided on the opposite side from the first lower sheet surface 10a. The second lower sheet surface 10b is closer to the wick sheet 30. The entire lower sheet 10 may be formed as a flat sheet. The entire lower sheet 10 may have a constant thickness. A housing member Ha that constitutes part of the housing H described above is attached to the first lower sheet surface 10a. The entire first lower sheet surface 10a may be covered with the housing member Ha. As illustrated in FIG. 4, an alignment hole 12 may be provided in each of the four corners of the lower sheet 10.

Figure 5:
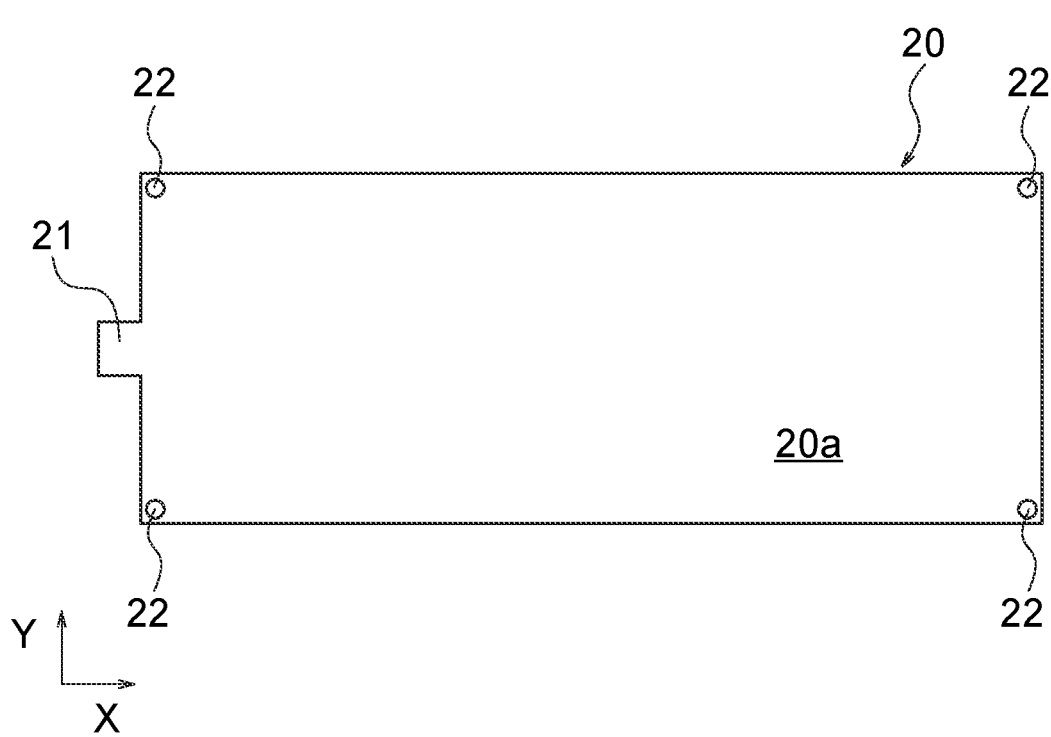
FIG. 5 is a bottom view of an upper sheet illustrated in FIG. 3.

As illustrated in FIG. 3, the upper sheet 20 has a first upper sheet surface 20a that is closer to the wick sheet 30, and a second upper sheet surface 20b provided on the opposite side from the first upper sheet surface 20a. The first upper sheet surface 20a is closer to the wick sheet 30. The entire upper sheet 20 may be formed as a flat sheet. The entire upper sheet 20 may have a constant thickness. The electronic device D described above is attached to the second upper sheet surface 20b. As illustrated in FIG. 5, an alignment hole 22 may be provided in each of the four corners of the upper sheet 20.

As illustrated in FIG. 3, the wick sheet 30 has a sheet body 31 and a vapor flow channel portion 50, a liquid flow channel portion 60, and a liquid storage portion 70 provided in the sheet body 31. The sheet body 31 has a first body surface 31a and a second body surface 31b provided on the opposite side from the first body surface 31a. The first body surface 31a is closer to the lower sheet 10. The second body surface 31b is closer to the upper sheet 20. The vapor flow channel portion 50, the liquid flow channel portion 60, and the liquid storage portion 70 constitute the sealed space 3 described above.

The second lower sheet surface 10b of the lower sheet 10 and the first body surface 31a of the sheet body 31 may be diffusion bonded to each other. The second lower sheet surface 10b and the first body surface 31a may be permanently bonded to each other. Similarly, the first upper sheet surface 20a of the upper sheet 20 and the second body surface 31b of the sheet body 31 may be diffusion bonded to each other. The first upper sheet surface 20a and the second body surface 31b may be permanently bonded to each other. Note that instead of using a diffusion bonding technique, the lower sheet 10, upper sheet 20, and wick sheet 30 may be bonded using another technique, such as brazing, if the sheets can be permanently bonded together. As used herein, the term "permanently bonded" is not defined strictly. The term is used to mean that the sheets are bonded to such a degree that the sealing of the sealed space 3 is maintained during the operation of the vapor chamber 1. It is only required that the lower sheet 10 and the wick sheet 30 are permanently bonded to maintain bonding between the lower sheet 10 and the wick sheet 30 during operation of the vapor chamber 1. It is only required that the upper sheet 20 and the wick sheet 30 are permanently bonded to maintain bonding between the upper sheet 20 and the wick sheet 30 during operation of the vapor chamber 1.

Figure 6:
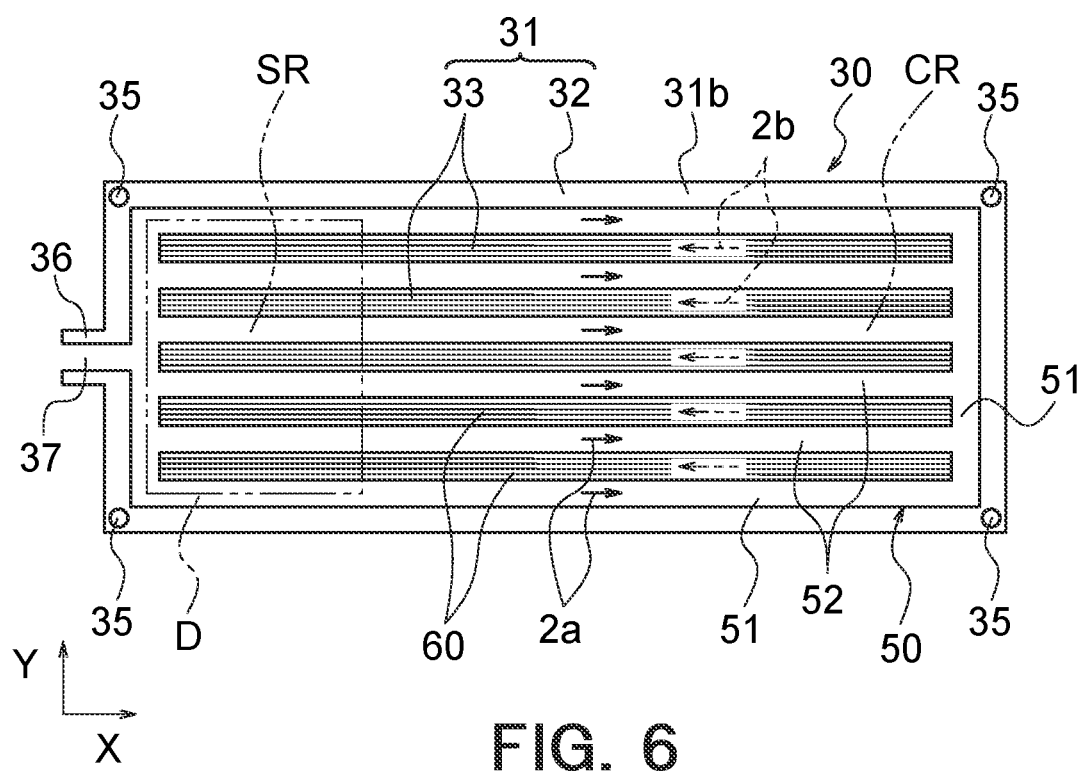
FIG. 6 is a top view of a wick sheet illustrated in FIG. 3.
Figure 7:
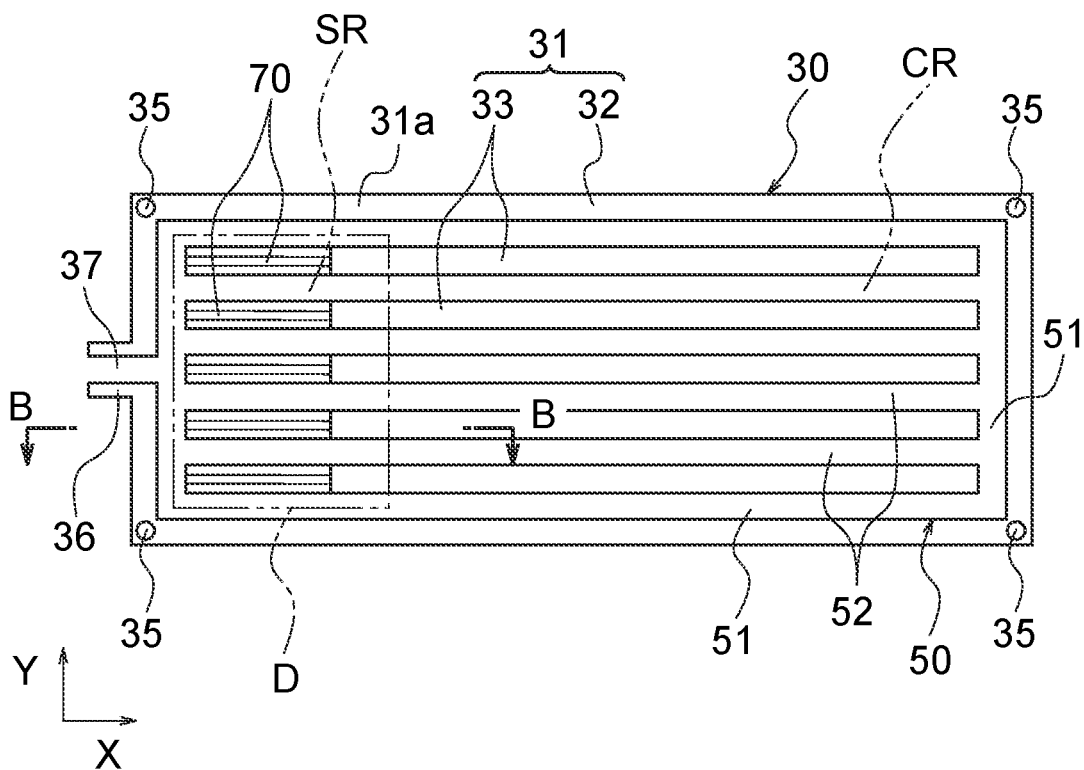
FIG. 7 is a bottom view of the wick sheet illustrated in FIG. 3.

The sheet body 31 of the wick sheet 30 according to the present embodiment includes a frame body portion 32 and a plurality of land portions 33. As illustrated in FIGS. 3, 6, and 7, the frame body portion 32 is formed in a rectangular frame shape in plan view. The land portions 33 are provided inside the frame body portion 32. The frame body portion 32 and the land portions 33 are portions where the material of the wick sheet 30 remains without being etched in the etching process (described below). The vapor flow channel portion 50 is defined inside the frame body portion 32. That is, the working vapor 2a flows inside the frame body portion 32 and around the land portions 33.

In the present embodiment, the land portions 33 may extend in an elongated shape so that the longitudinal direction thereof is the X direction in plan view. The planar shape of the land portion 33 may be an elongated rectangular shape. The X direction is an example of a first direction. The X direction corresponds to the right-left direction in FIG. 6. In addition, the land portions 33 are equally spaced apart from each other in a Y direction. The Y direction is an example of a second direction. The Y direction corresponds to the top-bottom direction in FIG. 6. The land portions 33 may be arranged parallel to one another. The working vapor 2a flows around each of the land portions 33 and is delivered toward the condensation region CR. This inhibits the flow of the working vapor 2a from being obstructed. A width w1 of the land portion 33 (refer to FIG. 8A) may be, for example, 100 μm to 1500 μm. Note that the width w1 of the land portion 33 is the dimension of the land portion 33 in the Y direction. The width w1 refers to the dimension at the position at which a penetration portion 34 (described below) exists in the thickness direction of the wick sheet 30.

The frame body portion 32 and the land portions 33 are diffusion bonded to the lower sheet 10 and to the upper sheet 20. Thus, the mechanical strength of the vapor chamber 1 can be increased. A wall surface 53a of a lower vapor flow channel recess 53 (described below) and a wall surface 54a of the upper vapor flow channel recess 54 (described below) constitute a side wall of the land portion 33. The first body surface 31a and the second body surface 31b of the sheet body 31 may be formed flat over the frame body portion 32 and the land portions 33.

The vapor flow channel portion 50 is an example of a penetration space that penetrates the sheet body 31. The vapor flow channel portion 50 is a channel through which mainly the working vapor 2a passes. The vapor flow channel portion 50 penetrates from the first body surface 31a to the second body surface 31b.

As illustrated in FIGS. 6 and 7, the vapor flow channel portion 50 in the present embodiment has a first vapor passage 51 and a plurality of second vapor passages 52. The first vapor passage 51 is formed between the frame body portion 32 and the land portions 33. The first vapor passage 51 is formed in a continuous manner inside the frame body portion 32 and outside the land portions 33. The planar shape of the first vapor passage 51 is a rectangular frame shape. Each of the second vapor passages 52 is formed between two neighboring land portions 33. The planar shape of the second vapor passage 52 is an elongated rectangle. The vapor flow channel portion 50 is partitioned into the first vapor passage 51 and the plurality of second vapor passages 52 by the plurality of land portions 33.

As illustrated in FIG. 3, the first vapor passage 51 and the second vapor passages 52 extend from the first body surface 31a to the second body surface 31b of the sheet body 31. Each of the first vapor passage 51 and the second vapor passages 52 is composed of the lower vapor flow channel recess 53 on the first lower sheet surface 10a and the upper vapor flow channel recess 54 on the upper sheet surface 20b. The lower vapor flow channel recess 53 communicates with the upper vapor flow channel recess 54 and, thus, the first vapor passage 51 and the second vapor passages 52 of the vapor flow channel portion 50 extend from the first body surface 31a to the second body surface 31b.

Figure 8A:
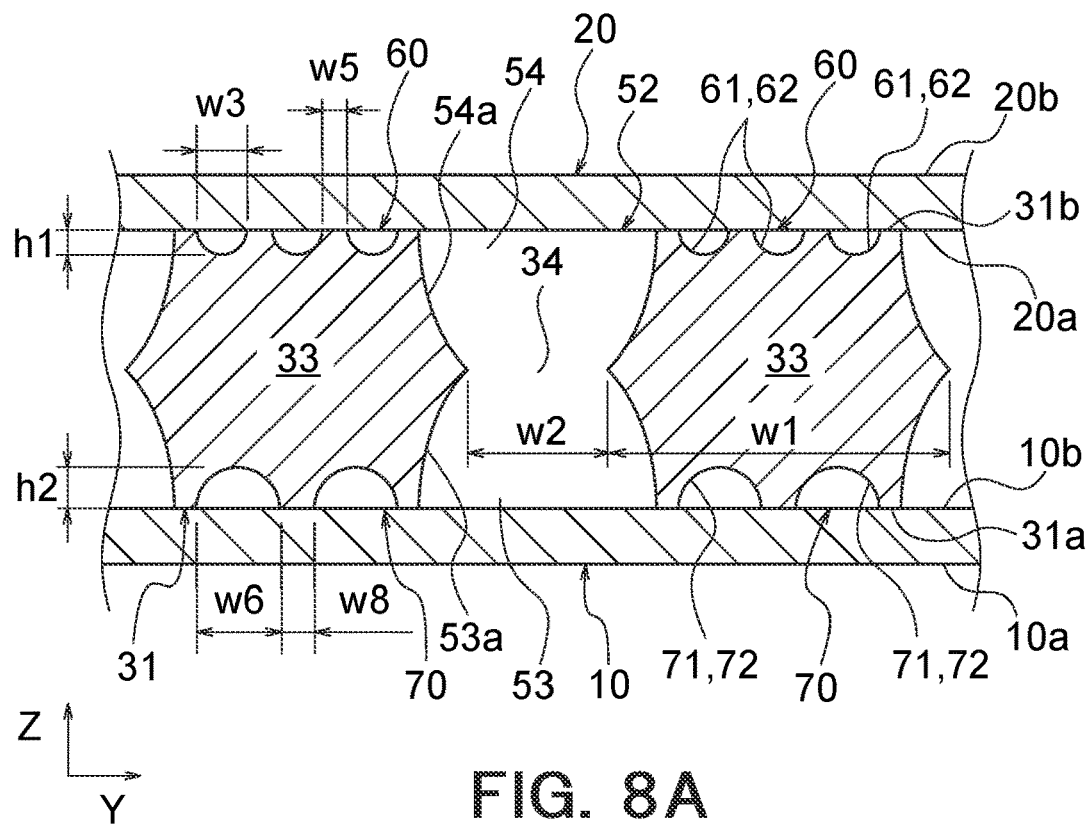
FIG. 8A is a partially enlarged sectional view of FIG. 3.

The lower vapor flow channel recess 53 is formed by the fact that the first body surface 31a of the wick sheet 30 is etched through an etching process (described below). The lower vapor flow channel recess 53 having a concave shape is formed on the first body surface 31a. As a result, as illustrated in FIG. 8A, the lower vapor flow channel recess 53 has the wall surface 53a that is curved. The wall surface 53a defines the lower vapor flow channel recess 53 and is curved so as to expand towards the second body surface 31b. The lower vapor flow channel recesses 53 formed in this manner constitute part (the lower half) of the first vapor passage 51 and part (the lower half) of the second vapor passage 52.

The upper vapor flow channel recess 54 is formed by the fact that the second body surface 31b of the wick sheet 30 is etched through an etching process (described below). The upper vapor flow channel recess 54 having a concave shape is formed on the second body surface 31b. As a result, as illustrated in FIG. 8A, the upper vapor flow channel recess 54 has the wall surface 54a that is curved. The wall surface 54a defines the upper vapor flow channel recess 54 and is curved so as to expand towards the first body surface 31a. The upper vapor flow channel recess 54 formed in this manner constitute part (the upper half) of the first vapor passage 51 and part (the upper half) of the second vapor passage 52.

As illustrated in FIG. 8A, the wall surface 53a of the lower vapor flow channel recess 53 and the wall surface 54a of the upper vapor flow channel recess 54 are connected to form the penetration portion 34. The wall surface 53a and the wall surface 54a are each curved toward the penetration portion 34. In this manner, the lower vapor flow channel recess 53 communicates with the upper vapor flow channel recess 54. In the present embodiment, like the planar shape of the first vapor passage 51, the planar shape of the penetration portion 34 in the first vapor passage 51 is a rectangular frame shape. Like the planar shape of the second vapor passage 52, the planar shape of the penetration portion 34 in the second vapor passage 52 is an elongated rectangle. The wall surface 53a of the lower vapor flow channel recess 53 may merge with the wall surface 54a of the upper vapor flow channel recess 54, and the ridge line may define the penetration portion 34. As illustrated in FIG. 8A, the ridge line may be formed so as to protrude inwardly of the vapor passages 51 and 52. The plane area of the first vapor passage 51 is minimized at the penetration portion 34, and the plane area of the second vapor passage 52 is minimized at the penetration portion 34. A width w2 (refer to FIG. 8A) of the penetration portion 34 may be, for example, 400 μm to 1600 μm. Note that the width w2 of the penetration portion 34 corresponds to a gap between two neighboring land portions 33 in the Y direction.

The position of the penetration portion 34 in a Z direction may be the middle position between the first lower sheet surface 10a and the upper sheet surface 20b. Alternatively, the position of the penetration portion 34 may be a position shifted downward or upward from the middle position. The position of the penetration portion 34 in the Z direction is any position as long as the lower vapor flow channel recess 53 communicates with the upper vapor flow channel recess 54.

In the present embodiment, the sectional shape of each of the first vapor passage 51 and the second vapor passage 52 is formed to include the penetration portion 34 defined by the ridge line formed to protrude inwardly. However, the shape is not limited thereto. For example, the sectional shape of the first vapor passage 51 and the sectional shape of the second vapor passage 52 may be trapezoidal, rectangular, or barrel-shaped.

The vapor flow channel portion 50 including the first vapor passage 51 and the second vapor passage 52 formed in this manner constitutes part of the above-described sealed space 3. As illustrated in FIG. 3, the vapor flow channel portion 50 according to the present embodiment is defined mainly by the lower sheet 10, the upper sheet 20, and the frame body portion 32 and the land portions 33 of the sheet body 31 described above. Each of the vapor passages 51 and 52 has a relatively large flow channel cross-sectional area so that the working vapor 2a passes through the vapor passages 51 and 52.

Note that for clarity of the drawing, FIG. 3 is an enlarged view of the first vapor passage 51, the second vapor passage 52, and the like. The numbers and arrangement of the vapor passages 51 and 52 differ from those in FIGS. 2, 6 and 7.

Note that although not illustrated, a plurality of support portions may be provided in the vapor flow channel portion 50 to support the land portions 33 with respect to the frame body portion 32. In addition, support portions may be provided to support two neighboring land portions 33. These support portions may be provided on either side of the land portion 33 in the X direction or on either side of the land portion 33 in the Y direction. It is desirable that the support portions is formed so as not to obstruct the flow of working vapor 2a dispersing through the vapor flow channel portion 50. For example, the support portion may be disposed at a position closer to one of the first and second body surfaces 31a and 31b of the sheet body 31 of the wick sheet 30, and a space functioning as a vapor flow channel recess may be formed at a position closer to the other of the first and second body surfaces 31a and 31b. This allows the thickness of the support portion to be less than that of the sheet body 31, and the first vapor passage 51 and the second vapor passages 52 can be prevented from being separated each other in the X and Y directions.

As illustrated in FIGS. 6 and 7, an alignment hole 35 may be provided in each of the four corners of the sheet body 31 of the wick sheet 30.

As illustrated in FIG. 2, the vapor chamber 1 may include an injection portion 4 at one edge thereof in the X direction, through which the working liquid 2b is injected into the sealed space 3. In the configuration illustrated in FIG. 2, the injection portion 4 is disposed at a position closer to the evaporation region SR. The injection portion 4 protrudes outward from the edge closer to the evaporation region SR.

More specifically, the injection portion 4 may include a lower injection protrusion 11, an upper injection protrusion 21, and a wick sheet injection protrusion 36. As illustrated in FIG. 4, the lower injection protrusion 11 is part of the lower sheet 10. As illustrated in FIG. 5, the upper injection protrusion 21 is part of the upper sheet 20. As illustrated in FIGS. 6 and 7, the wick sheet injection protrusion 36 is part of the sheet body 31. The wick sheet injection protrusion 36 has an injection flow channel 37 formed therein. The injection flow channel 37 extends from the first body surface 31a to the second body surface 31b of the sheet body 31 and penetrates the sheet body 31 (more specifically, the wick sheet injection protrusion 36) in the Z direction. In addition, the injection flow channel 37 communicates with the vapor flow channel portion 50. The working liquid 2b is injected into the sealed space 3 through the injection flow channel 37. Note that the injection flow channel 37 may communicate with the liquid flow channel portions 60, depending on the arrangement of the liquid flow channel portions 60. The upper and lower surfaces of the wick sheet injection protrusion 36 are formed in a flat shape. In addition, the upper surface of the lower injection protrusion 11 and the lower surface of the upper injection protrusion 21 are formed in a flat shape. The injection protrusions 11, 21, and 38 may have the same flat shape.

In the present embodiment, an example is illustrated in which the injection portion 4 is provided at one of two edges in the X direction of the vapor chamber 1. However, the position of the injection portion 4 is not limited thereto, and the injection portion 4 can be provided at any position. In addition, the injection flow channel 37 provided in the wick sheet injection protrusion 36 does not necessarily have to penetrate the sheet body 31 as long as the working liquid 2b can be injected. In this case, the injection flow channel 37 that communicates with the vapor flow channel portion 50 can be formed by the fact that only one of the first body surface 31a and the second body surface 31b of the sheet body 31 is etched through an etching process.

As illustrated in FIGS. 3, 6 and 8A, the liquid flow channel portion 60 is provided on the second body surface 31b of the sheet body 31 of the wick sheet 30. The liquid flow channel portion 60 may be a channel through which mainly the working liquid 2b passes. The liquid flow channel portion 60 constitutes part of the sealed space 3 described above. The liquid flow channel portion 60 communicates with the vapor flow channel portion 50. The liquid flow channel portion 60 is configured so as to have a capillary structure for delivering the working liquid 2b to the evaporation region SR. The liquid flow channel portion 60 is also referred to as a wick. In the present embodiment, the liquid flow channel portion 60 is provided on the second body surface 31b of each of the land portions 33 of the wick sheet 30. The liquid flow channel portion 60 may be formed over the entire second body surface 31b of each land portion 33. The liquid flow channel portion 60 need not be provided on the first body surface 31a of each land portion 33.

Figure 9:
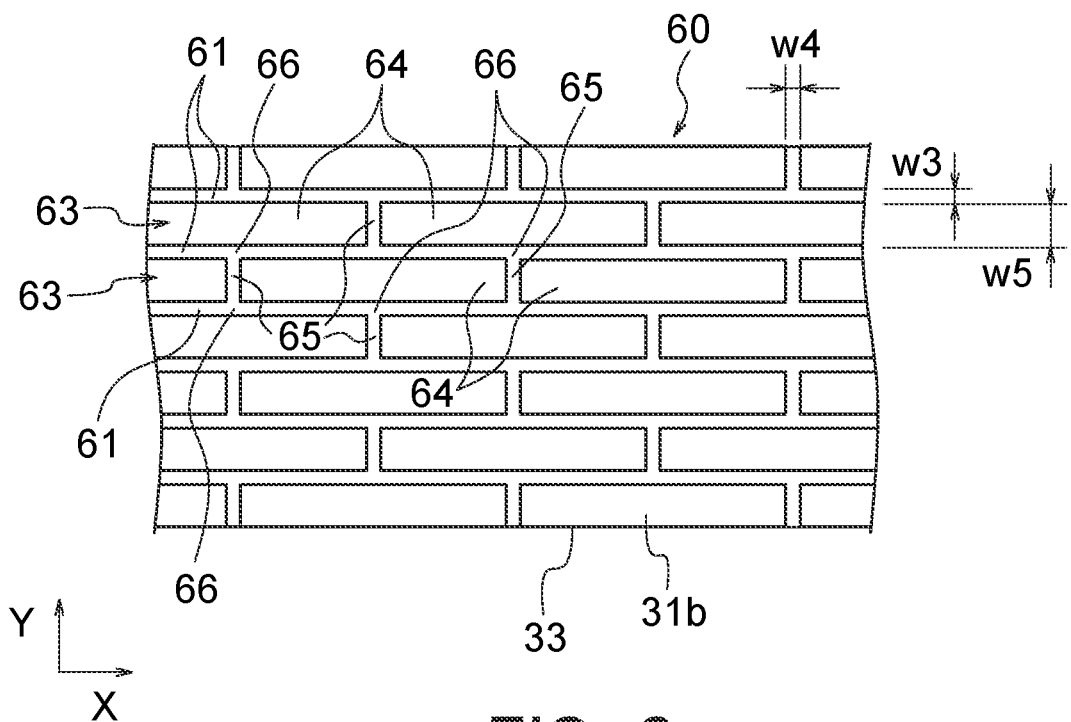
FIG. 9 is a partially enlarged top view of a liquid flow channel portion illustrated in FIG. 6.

As illustrated in FIG. 9, the liquid flow channel portion 60 is an example of a first groove assembly. More specifically, the liquid flow channel portion 60 includes a plurality of liquid flow channel mainstream grooves 61 and a plurality of liquid flow channel communication grooves 65. The liquid flow channel mainstream groove 61 is an example of a first mainstream groove. The liquid flow channel communication groove 65 is an example of the first communication groove. The liquid flow channel mainstream groove 61 and the liquid flow channel communication groove 65 are grooves through which the working liquid 2b passes. The liquid flow channel communication groove 65 communicates with the liquid flow channel mainstream groove 61.

As illustrated in FIG. 9, each of the liquid flow channel mainstream grooves 61 extends in the X direction. The liquid flow channel mainstream groove 61 has such a flow channel cross-sectional area that mainly the working liquid 2b flows by capillary action. The flow channel cross-sectional area of the liquid flow channel mainstream groove 61 is less than that of the vapor passages 51 and 52. In this manner, the liquid flow channel mainstream groove 61 is configured to deliver, to the evaporation region SR, the working liquid 2b condensed from the working vapor 2a. The liquid flow channel mainstream grooves 61 may be spaced equally apart in the Y direction that is orthogonal to the X direction.

The liquid flow channel mainstream grooves 61 are formed by the fact that the second body surface 31b of the sheet body 31 of the wick sheet 30 is etched through an etching process (described below). As a result, each of the liquid flow channel mainstream grooves 61 has a curved wall surface 62, as illustrated in FIG. 8A. The wall surface 62 defines the liquid flow channel mainstream groove 61 and is curved so as to expand towards the first body surface 31a.

As illustrated in FIGS. 8A and 9, a width w3 of the liquid flow channel mainstream groove 61 may be, for example, 5 µm to 150 µm. The width w3 of the liquid flow channel mainstream groove 61 refers to the dimension of the liquid flow channel mainstream groove 61 at the second body surface 31b. The width w3 corresponds to the dimension in the Y direction. As illustrated in FIG. 8A, a depth h1 of the liquid flow channel mainstream groove 61 may be, for example, 3 µm to 150 µm. The depth h1 corresponds to the dimension in the Z direction.

As illustrated in FIG. 9, each of the liquid flow channel communication grooves 65 extends in a direction that differs from the X direction. In the present embodiment, each of the liquid flow channel communication grooves 65 extends in the Y direction. The liquid flow channel communication groove 65 is formed orthogonal to the liquid flow channel mainstream groove 61. Some of the liquid flow channel communication grooves 65 interconnect two neighboring liquid flow channel mainstream grooves 61. The other liquid flow channel communication grooves 65 connect the first vapor passage 51 or the second vapor passages 52 to the liquid flow channel mainstream groove 61. That is, these liquid flow channel communication grooves 65 extend from the edge in the Y direction of the land portion 33 to the liquid flow channel mainstream groove 61 adjacent to the edge. In this way, the first vapor passage 51 communicates with the liquid flow channel mainstream groove 61, and the second vapor passage 52 communicates with the liquid flow channel mainstream groove 61.

The liquid flow channel communication groove 65 has such a flow channel cross-sectional area that mainly the working liquid 2b flows by the capillary action. The flow channel cross-sectional area of the liquid flow channel communication groove 65 is less than that of the vapor passages 51 and 52. The liquid flow channel communication grooves 65 may be disposed so as to be spaced equally apart in the X direction.

Like the liquid flow channel mainstream grooves 61, the liquid flow channel communication grooves 65 are formed through an etching process. Each of the liquid flow channel communication grooves 65 has a curved wall (not illustrated) similar to that of the liquid flow channel mainstream grooves 61. As illustrated in FIG. 9, a width w4 of the liquid flow channel communication groove 65 may be the same as the width w3 of the liquid flow channel mainstream groove 61. However, the width w4 may be greater or less than the width w3. The width w4 corresponds to the dimension in the X direction. The depth of the liquid flow channel communication groove 65 may be the same as the depth h1 of the liquid flow channel mainstream groove 61. However, the depth of the liquid flow channel communication groove 65 may be greater or less than the depth h1.

As illustrated in FIG. 9, a convex-portion row 63 is provided between two neighboring liquid flow channel mainstream grooves 61. Each of the convex-portion rows 63 includes a plurality of convex portions 64 arranged in the X direction. The convex portion 64 is an example of a liquid flow channel protrusion portion. The convex portions 64 are provided in the liquid flow channel portion 60. The convex portions 64 protrude from the sheet body 31 and are in contact with the upper sheet 20. Each of the convex portions 64 is formed in a rectangular shape in plan view such that the X direction is the longitudinal direction. Each of the liquid flow channel mainstream grooves 61 is disposed between two neighboring convex portions 64 in the Y direction. Each of the liquid flow channel communication grooves 65 is disposed between two neighboring convex portions 64 in the X direction. The liquid flow channel communication groove 65 extends in the Y direction and interconnects two neighboring liquid flow channel mainstream grooves 61 in the Y direction. This allows the working liquid 2b to flow back and forth between the liquid flow channel mainstream grooves 61.

The convex portion 64 is a portion where the material of the wick sheet 30 remains without being etched in the etching process (described below). In the present embodiment, the planar shape of the convex portion 64 is rectangular, as illustrated in FIG. 9. The planar shape of the convex portion 64 corresponds to the planar shape of the sheet body 31 at the location of the second body surface 31b.

In the present embodiment, the convex portions 64 are arranged in a staggered pattern. More specifically, the convex portions 64 of two neighboring convex-portion rows 63 in the Y direction are displaced from each other in the X direction. The amount of displacement may be half the arrangement pitch of the convex portions 64 in the X direction. A width w5 of the convex portion 64 may be, for example, 5 µm to 500 µm. The width w5 of the convex portion 64 refers to the dimension at the second body surface 31b. The width w5 corresponds to the dimension in the Y direction. Note that the arrangement of the convex portions 64 is not limited to a staggered pattern, but may be arranged in parallel. In this case, the convex portions 64 of the neighboring convex-portion rows 63 in the Y direction are also aligned in the X direction (refer to FIG. 19).

The liquid flow channel mainstream groove 61 includes a liquid flow channel intersection portion 66. The liquid flow channel intersection portion 66 is an example of a first intersection portion. The liquid flow channel intersection portion 66 is a portion of the liquid flow channel mainstream groove 61 in which the liquid flow channel intersection portion 66 communicates with the liquid flow channel communication groove 65. In the liquid flow channel intersection portion 66, the liquid flow channel mainstream groove 61 and the liquid flow channel communication groove 65 communicate with each other in a T-shape. This prevents that in the liquid flow channel intersection portion 66 in which one liquid flow channel mainstream groove 61 communicates with the liquid flow channel communication groove 65 located on one side, the liquid flow channel communication groove 65 located on the other side communicates with the liquid flow channel mainstream groove 61. In this manner, in the liquid flow channel intersection portion 66, the wall surface 62 of the liquid flow channel mainstream groove 61 is prevented from being cut out on both sides and, thus, the wall surface 62 on one side is made to remain. For example, in one of the liquid flow channel intersection portions 66, the upper liquid flow channel communication groove 65 and the lower liquid flow channel communication groove 65 in FIG. 9 are prevented from communicating with the liquid flow channel mainstream groove 61. In this case, both the upper wall surface 62 and the lower wall surface 62 in FIG. 9 can be prevented from being cut out at the liquid flow channel intersection portion 66. Thus, even in the liquid flow channel intersection portion 66, the capillary action of the working fluid in the liquid flow channel mainstream grooves 61 can be produced. As a result, a decrease in the propulsive force of the working liquid 2b towards the evaporation region SR can be reduced in the liquid flow channel intersection portion 66.

As illustrated in FIGS. 3, 7 and 8A, the liquid storage portions 70 are provided on the first body surface 31a of the sheet body 31 of the wick sheet 30. Each of the liquid storage portions 70 may be a portion that mainly stores the working liquid 2b. The liquid storage portion 70 constitutes part of the sealed space 3 described above. The liquid storage portion 70 communicates with the vapor flow channel portion 50 and further communicates with the liquid flow channel portion 60 via the vapor flow channel portion 50. In the present embodiment, the liquid storage portions 70 are provided on the first body surface 31a of each of the land portions 33 of the wick sheet 30.

Figure 11:
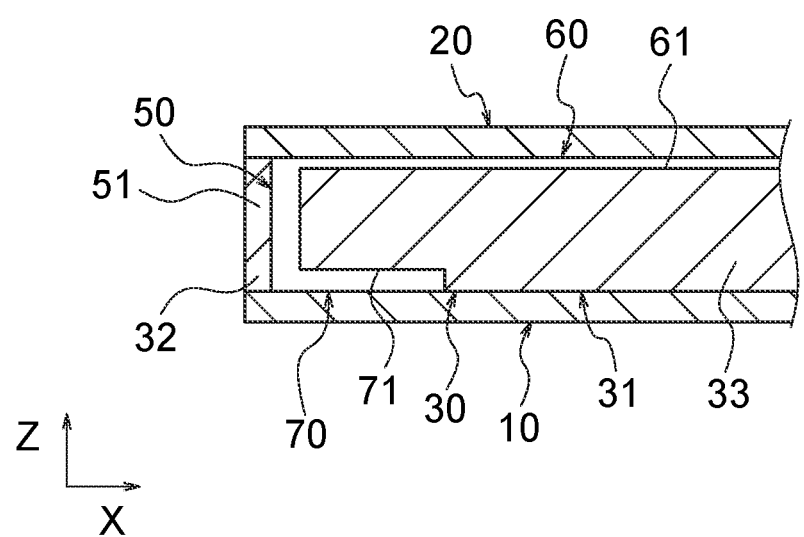
FIG. 11 is a partial sectional view taken along line B-B of FIG. 7.

As illustrated in FIGS. 7 and 11, the liquid storage portion 70 according to the present embodiment may be disposed on one side of the land portion 33 in the X direction. The liquid storage portion 70 may be formed on the one side of the center of the land portion 33 in the X direction. The liquid storage portion 70 may be disposed on the side of the evaporation region SR and may be disposed on the left side of the land portion 33 as illustrated in FIG. 7. More specifically, the liquid storage portion 70 is formed so as to continuously extend from one edge (in the X direction) of the land portion 33 closer to the evaporation region SR toward the other edge up to a predetermined position. In FIG. 7, the liquid storage portion 70 is formed from the left edge toward the right edge up to a predetermined position. According to the present embodiment, the liquid storage portion 70 may be disposed in the evaporation region SR. However, the location of the liquid storage portion 70 is not limited thereto. The liquid storage portion 70 may partially extend to the outside of the evaporation region SR. If at least part of the liquid storage portion 70 is disposed in the evaporation region SR, the working liquid 2b stored in the liquid storage portion 70 easily evaporates upon receiving heat of the electronic device D. The liquid storage portion 70 may be disposed in a region that overlaps the electronic device D.

Figure 10:
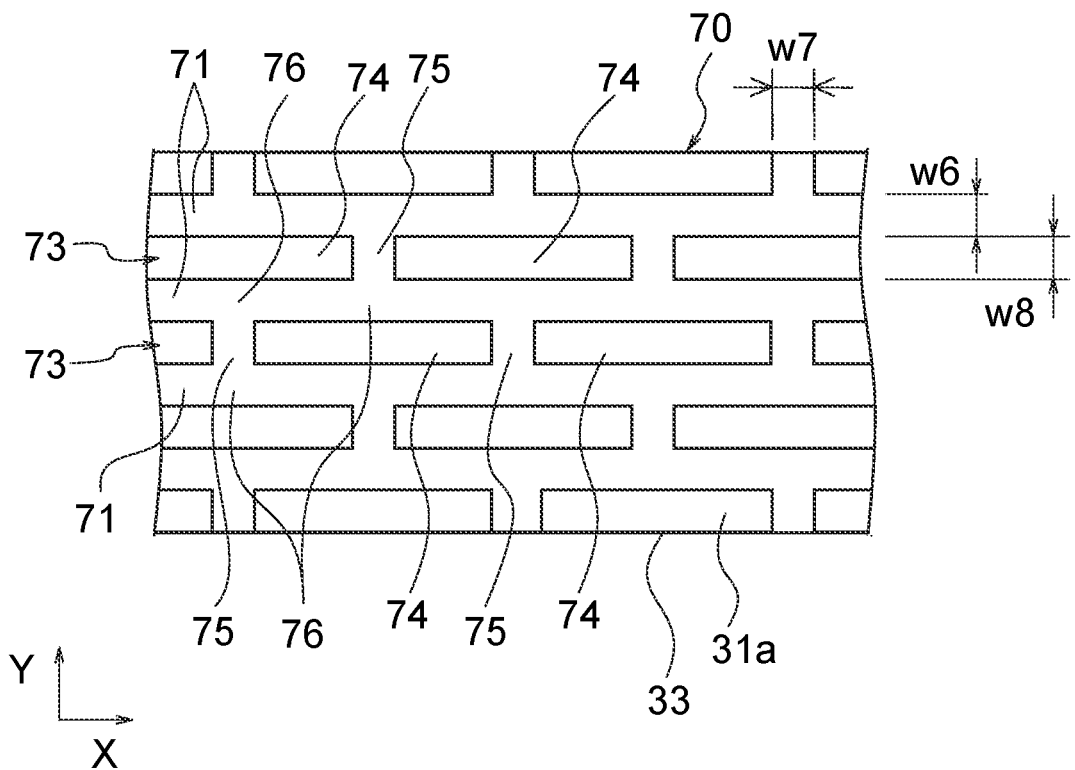
FIG. 10 is a partially enlarged bottom view of a liquid storage portion illustrated in FIG. 7.

As illustrated in FIG. 10, the liquid storage portion 70 is an example of a second groove assembly. More specifically, the liquid storage portion 70 includes a plurality of liquid storage mainstream grooves 71 and a plurality of liquid storage communication grooves 75. The liquid storage mainstream groove 71 is an example of a second mainstream groove. The liquid storage communication groove 75 is an example of a second communication groove. The liquid storage mainstream groove 71 and the liquid storage communication groove 75 are grooves through which the working liquid 2b passes. The liquid storage communication groove 75 communicates with the liquid storage mainstream groove 71.

As illustrated in FIG. 10, each of the liquid storage mainstream grooves 71 extends in the X direction. As illustrated in FIGS. 7 and 11, the liquid storage mainstream grooves 71 is formed so as to continuously extend from one edge (in the X direction) of the land portion 33 closer to the evaporation region SR toward the other edge up to a predetermined position. The liquid storage mainstream groove 71 defines the range of the liquid storage portion 70 in the X direction. The liquid storage mainstream groove 71 has such a flow channel cross-sectional area that mainly the working liquid 2b flows by capillary action. The flow channel cross-sectional area of the liquid storage mainstream groove 71 is less than that of the vapor passages 51 and 52. However, the flow channel cross-sectional area of the liquid storage mainstream groove 71 may be greater than that of the liquid flow channel mainstream groove 61 described above. The capillary force that acts on the working liquid 2b in the liquid storage mainstream groove 71 may be smaller than the capillary force that acts on the working liquid 2b in the liquid flow channel mainstream grooves 61. In this way, the liquid storage mainstream groove 71 can draw the working liquid 2b into the liquid storage portion 70 and ensure the stored volume of the working liquid 2b. The liquid storage mainstream grooves 71 may be disposed so as to be spaced equally apart in the Y direction that is orthogonal to the X direction.

The liquid storage mainstream groove 71 is formed by the fact that the first body surface 31a of the sheet body 31 of the wick sheet 30 is etched through an etching process (described below). As a result, as illustrated in FIG. 8A, the liquid storage mainstream groove 71 has a curved wall surface 72. The wall surface 72 defines the liquid storage mainstream groove 71 and is curved so as to expand toward the second body surface 31b.

As illustrated in FIGS. 8A and 10, a width w6 of the liquid storage mainstream groove 71 may be greater than a width w3 of the liquid flow channel mainstream groove 61 described above. The width w6 may be, for example, 10 μm to 250 μm. Note that the width w6 of the liquid storage mainstream groove 71 refers to the dimension at the first body surface 31a. The width w6 corresponds to the dimension in the Y direction. In addition, as illustrated in FIG. 8A, a depth h2 of the liquid storage mainstream groove 71 may be greater than the depth h1 of the liquid flow channel mainstream groove 61 described above. The depth h2 may be, for example, 5 μm to 200 μm. The depth h2 corresponds to the dimension in the Z direction.

As illustrated in FIG. 10, the liquid storage communication grooves 75 extend in a direction that differs from the X direction. In the present embodiment, the liquid storage communication grooves 75 extend in the Y direction. The liquid storage communication grooves 75 are formed orthogonal to the liquid storage mainstream grooves 71. Some of the liquid storage communication grooves 75 interconnect two neighboring liquid storage mainstream grooves 71. The other liquid storage communication grooves 75 connect the first vapor passages 51 or the second vapor passages 52 to the liquid storage mainstream groove 71. That is, these liquid storage communication grooves 75 extend from the edge in the Y direction of the land portion 33 to the liquid storage mainstream groove 71 adjacent to the edge. In this way, the first vapor passage 51 communicates with the liquid storage mainstream groove 71, and the second vapor passage 52 communicates with the liquid storage mainstream groove 71.

The liquid storage communication groove 75 has such a flow channel cross-sectional area that mainly the working liquid 2b flows by capillary action. The flow channel cross-sectional area of the liquid storage communication groove 75 is less than that of the vapor passages 51 and 52.

However, the flow channel cross-sectional area of the liquid storage communication groove may be greater than that of the liquid flow channel communication groove 65 described above. The capillary force that acts on the working liquid 2b in the liquid storage communication groove 75 may be smaller than the capillary force that acts on the working liquid 2b in the liquid flow channel communication groove 65. In this way, the liquid storage communication groove 75 can draw the working liquid 2b into the liquid storage portion 70 and ensure the stored volume of the working liquid 2b. The liquid storage communication grooves 75 may be disposed so as to be spaced equally apart in the X direction.

Like the liquid storage mainstream grooves 71, the liquid storage communication grooves 75 are formed through an etching process. Like the liquid storage mainstream grooves 71, each of the liquid storage communication grooves 75 has a curved wall surface (not illustrated). As illustrated in FIG. 10, a width w7 of the liquid storage communication groove 75 may be the same as the width w6 of the liquid storage mainstream groove 71. However, the width w7 may be greater or less than the width w6. The width w7 corresponds to the dimension in the X direction. The depth of the liquid storage communication groove 75 may be the same as the depth h2 of the liquid storage mainstream groove 71. However, the depth of the liquid storage communication groove 75 may be greater or less than the depth h2.

As illustrated in FIG. 10, a convex-portion row 73 is provided between two neighboring liquid storage mainstream grooves 71. Each of the convex-portion rows 73 includes a plurality of convex portions 74 arranged in the X direction. The convex portion 74 is an example of a liquid storage protrusion portion. The convex portions 74 are provided in the liquid storage portion 70. The convex portions 74 protrude from the sheet body 31 and are in contact with the lower sheet 10. Each of the convex portions 74 having a rectangular shape in plan view is formed such that the X direction is the longitudinal direction. Each of the liquid storage mainstream grooves 71 is disposed between two neighboring convex portions 74 in the Y direction. Each of the liquid storage communication grooves 75 is disposed between two neighboring convex portions 74 in the X direction. The liquid storage communication groove 75 extends in the Y direction and enables two neighboring liquid storage mainstream grooves 71 in the Y direction to communicate with each other. This allows the working liquid 2b to flow back and forth between the liquid storage mainstream grooves 71.

The convex portion 74 is a portion where the material of the wick sheet 30 remains without being etched in the etching process (described below). In the present embodiment, the planar shape of the convex portion 74 is rectangular, as illustrated in FIG. 10. The planar shape of the convex portion 74 corresponds to the planar shape at the position of the first body surface 31a of the sheet body 31.

In the present embodiment, the convex portions 74 are arranged in a staggered pattern. More specifically, the convex portions 74 of two neighboring convex-portion rows 73 are displaced from each other in the X direction. The amount of displacement may be half the arrangement pitch of the convex portions 74 in the X direction. A width w8 of the convex portion 74 may be, for example, 10 µm to 100 µm. The width w8 of the convex portion 74 refers to the dimension at the first body surface 31a. The width w8 corresponds to the dimension in the Y direction. Note that the arrangement of the convex portions 74 is not limited to a staggered pattern, but may be arranged in parallel. In this case, the convex portions 74 of the neighboring convex-portion rows 73 in the Y direction are also aligned in the X direction (refer to FIG. 19).

In this way, the width w6 of the liquid storage mainstream groove 71 may be greater than w3 of the liquid flow channel mainstream groove 61. The width w6 corresponds to a gap between a pair of the convex portions 74 neighboring each other in the Y direction. The width w6 of the liquid storage mainstream groove 71 may be less than the width w2 of the penetration portion 34. The width w2 corresponds to a gap between a pair of the land portions 33 neighboring each other in the Y direction.

Figure 8B:
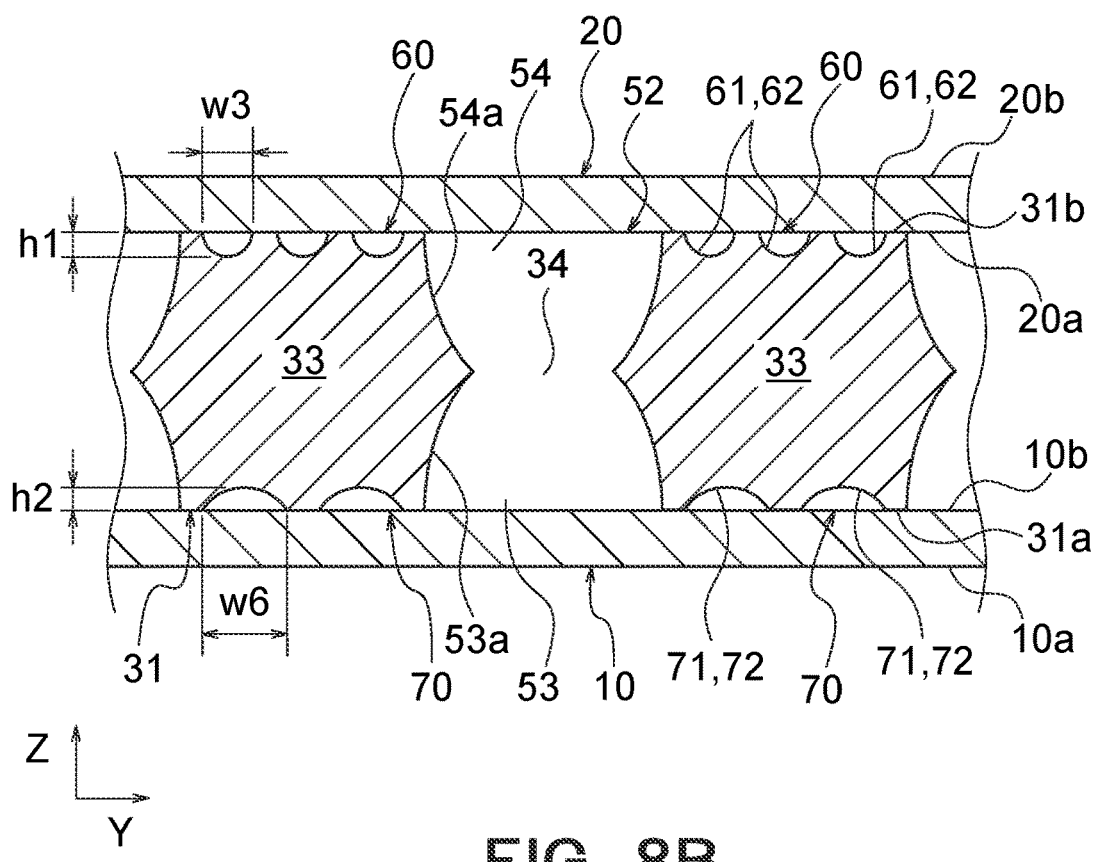
FIG. 8B is a partially enlarged sectional view of another example illustrated in FIG. 8A.
Figure 8C:
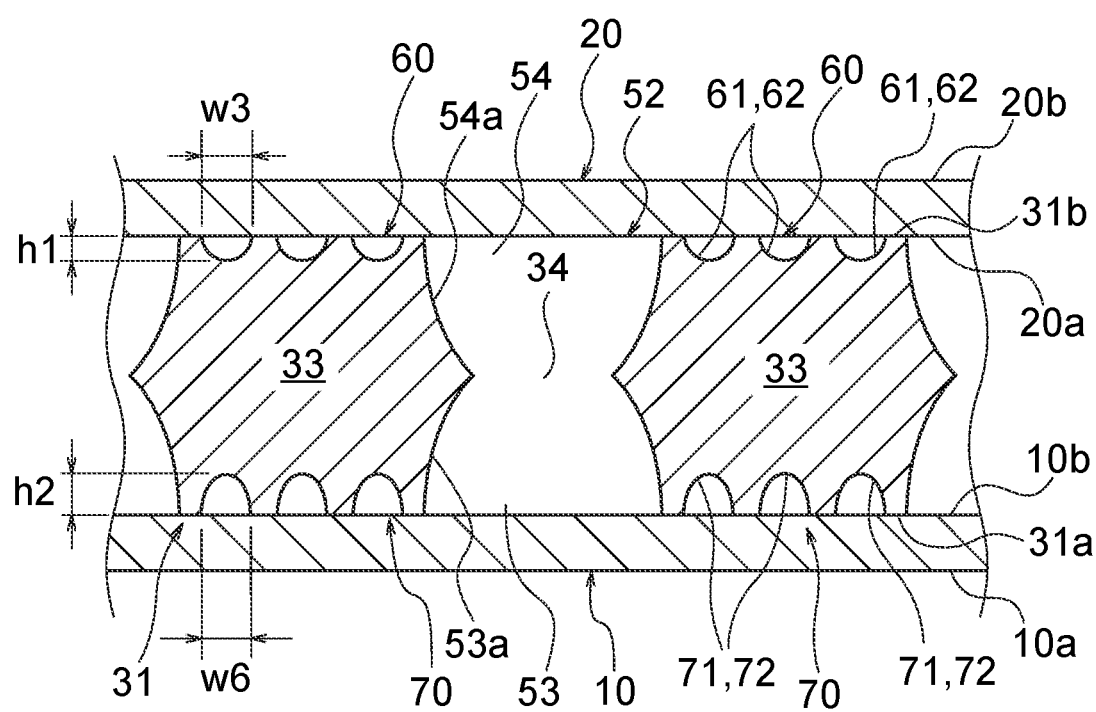
FIG. 8C is a partially enlarged sectional view of another example illustrated in FIG. 8A.

In the present embodiment, as described above, the flow channel cross-sectional area of the liquid storage mainstream groove 71 of the liquid storage portion 70 is greater than that of the liquid flow channel mainstream groove 61 of the liquid flow channel portion 60. To satisfy the flow channel cross-sectional area relationship, in the example illustrated in FIG. 8A, the width w6 of the liquid storage mainstream groove 71 is greater than the width w3 of the liquid flow channel mainstream groove 61, and the depth h2 of the liquid storage mainstream groove 71 is greater than the depth h1 of the liquid flow channel mainstream groove 61. However, the relationship is not limited thereto, and any relationship between the width and depth can be employed as long as the flow channel cross-sectional area of the liquid storage mainstream groove 71 is greater than that of the liquid flow channel mainstream groove 61. For example, as illustrated in FIG. 8B, if the width w6 is greater than the width w3, the depth h2 may be the same as the depth h1. Even in this case, the flow channel cross-sectional area of the liquid storage mainstream groove 71 can be greater than that of the liquid flow channel mainstream groove 61. In addition, as illustrated in FIG. 8C, when the depth h2 is greater than the depth h1, the width w6 may be the same as the width w3. Even in this case, the flow channel cross-sectional area of the liquid storage mainstream groove 71 can be greater than that of the liquid flow channel mainstream groove 61. As used herein, the flow channel cross-sectional area of a groove corresponds to the area occupied by the groove in the cross-section in a direction orthogonal to the direction in which the groove extends. For example, the flow channel cross-sectional area of the liquid flow channel mainstream groove 61 corresponds to the area occupied by the groove 61 (or the space defined by the wall surface 62 of the groove 61) in the cross-section in the Y direction of the liquid flow channel mainstream groove 61.

The number of liquid storage mainstream grooves 71 provided in the land portion 33 may be less than the number of liquid flow channel mainstream grooves 61 provided in the land portion 33. In the present embodiment, the land portion 33 extends in the X direction and has an elongated rectangular shape. In addition, the width of the land portion 33 at the first body surface 31a is the same as the width of the land portion 33 at the second body surface 31b. In this case, the flow channel cross-sectional area of the liquid storage mainstream groove 71 can be greater than that of the liquid flow channel mainstream groove 61.

The liquid storage mainstream groove 71 includes a liquid storage intersection portion 76. The liquid storage intersection portion 76 is an example of a second intersection portion. The liquid storage intersection portion 76 is a portion of the liquid storage mainstream groove 71 where the liquid storage mainstream groove 71 communicates with the liquid storage communication groove 75. At the liquid storage intersection portion 76, the liquid storage mainstream groove 71 and the liquid storage communication groove 75 communicates with each other in a T-shape. This prevents that in the liquid storage intersection portion 76 where one liquid storage mainstream groove 71 communicates with the liquid storage communication groove 75 located on one side, the liquid storage communication groove 75 located on the other side communicates with the liquid storage mainstream groove 71. In this manner, in the liquid storage intersection portion 76, the wall surface 72 of the liquid storage mainstream groove 71 is prevented from being cut out on both sides and, thus, the wall surface 72 on one side is made to remain. For example, in one liquid storage intersection portion 76, the upper liquid storage communication groove 75 and the lower liquid storage communication groove 75 in FIG. 10 are prevented from communicating with the liquid storage mainstream groove 71. In this case, both the upper wall surface 72 and the lower wall surface 72 in FIG. 10 can be prevented from being cut out at the liquid storage intersection portion 76. Thus, even in the liquid storage intersection portion 76, capillary action of the working fluid in the liquid storage mainstream groove 71 can be produced.

Note that the materials of the lower sheet 10, the upper sheet 20, and the wick sheet 30 are not limited to particular materials as long as they have sufficient thermal conductivity. The lower sheet 10, the upper sheet 20, and the wick sheet 30 may contain copper or a copper alloy, for example. In this case, the thermal conductivity of each of the sheets 10, 20, and 30 can be increased, and the heat dissipation efficiency of the vapor chamber 1 can be increased. In addition, if pure water is used as the working fluids 2a and 2b, the occurrence of corrosion can be prevented. Note that other metal materials, such as aluminum and titanium, or other metal alloy materials, such as stainless steel, can be used for the sheets 10, 20, and 30, as long as a desired heat dissipation efficiency can be obtained and the occurrence of corrosion can be prevented.

A thickness t1 of the vapor chamber 1 illustrated in FIG. 3 may be, for example, 100 μm to 1000 μm. By setting the thickness t1 of the vapor chamber 1 to 100 μm or greater, the vapor flow channel portion 50 can appropriately be provided. Thus, the function of the vapor chamber 1 can appropriately be performed. In contrast, by setting the thickness t1 to 1000 μm or less, the thickness t1 of the vapor chamber 1 can be inhibited from increasing.

A thickness t2 of the lower sheet 10 may be, for example, 6 μm to 100 μm. By setting the thickness t2 of the lower sheet 10 to 6 μm or greater, the mechanical strength of the lower sheet 10 can be ensured. In contrast, by setting the thickness t2 of the lower sheet 10 to 100 μm or less, the thickness t1 of the vapor chamber 1 can be inhibited from increasing. Similarly, a thickness t3 of the upper sheet 20 may be set in the same way as the thickness t2 of the lower sheet 10. The thickness t3 of the upper sheet 20 may differ from the thickness t2 of the lower sheet 10.

A thickness t4 of the wick sheet 30 may be, for example, 50 μm to 400 μm. By setting the thickness t4 of the wick sheet 30 to 50 μm or greater, the vapor flow channel portion 50 can appropriately be provided. Therefore, the function of vapor chamber 1 can appropriately be performed. In contrast, by setting the thickness t4 to 400 μm or less, the thickness t1 of the vapor chamber 1 can be inhibited from increasing.

Figure 13:
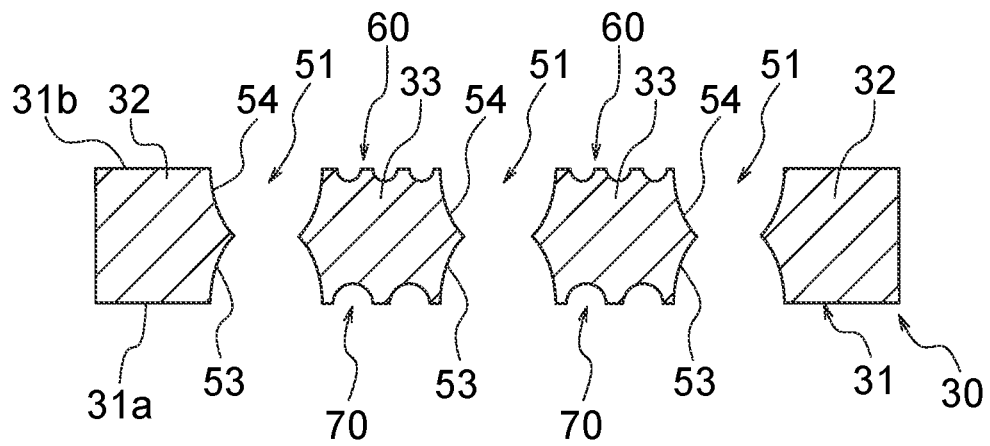
FIG. 13 is a diagram illustrating an etching process of the method for manufacturing the vapor chamber according to the first embodiment.
Figure 14:
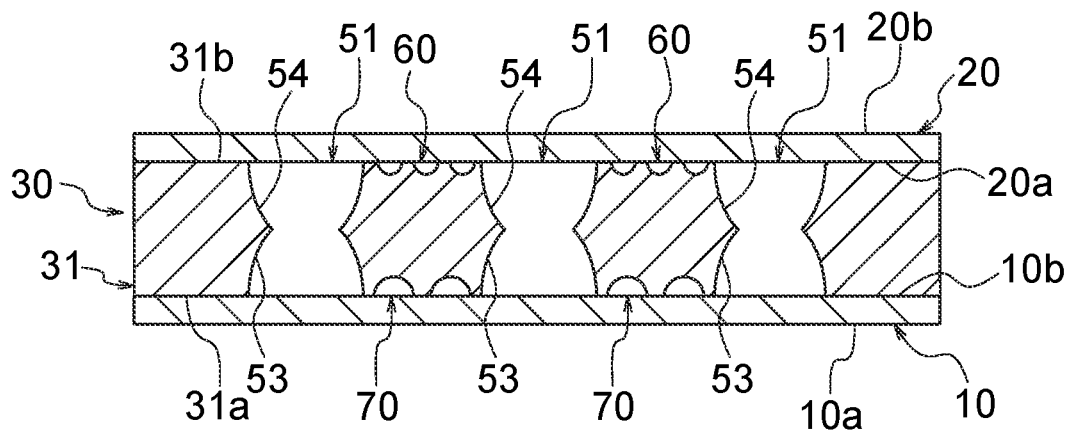
FIG. 14 is a diagram illustrating a joining process of the method for manufacturing the vapor chamber according to the first embodiment.

The method for manufacturing the vapor chamber 1 having the above-described configuration according to the present embodiment is described below with reference to FIGS. 12 to 14. Note that FIGS. 12 to 14 illustrate sectional views similar to that in FIG. 3.

The process of producing the wick sheet 30 is described first.

Figure 12:
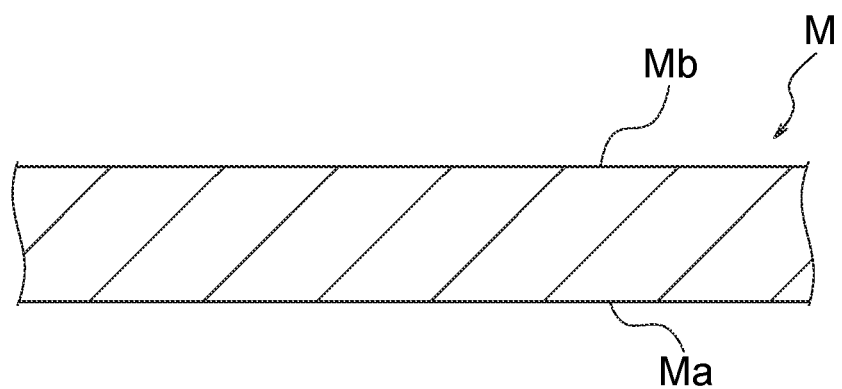
FIG. 12 is a diagram illustrating a wick sheet preparation process of a method for manufacturing the vapor chamber according to the first embodiment.

As illustrated in FIG. 12, a flat metal sheet M is prepared first in a preparatory process. The metal sheet M has a first material surface Ma and a second material surface Mb. The metal sheet M may be made of a rolled material having a desired thickness.

After the preparation process, an etching process is performed. In the etching process, the metal sheet M is etched from each of the first material surface Ma and the second material surface Mb, as illustrated in FIG. 13. In this manner, the vapor flow channel portion 50, the liquid flow channel portion 60, and the liquid storage portion 70 are formed in the metal sheet M.

More specifically, a patterned resist film (not illustrated) is formed on each of the first material surface Ma and the second material surface Mb of the metal sheet M by photolithography technique. Thereafter, the first material surface Ma and the second material surface Mb of the metal sheet M are etched through the openings of the patterned resist film. As a result, the first material surface Ma and the second material surface Mb of the metal sheet M are etched according to the pattern to form the vapor flow channel portion 50, the liquid flow channel portion 60, and the liquid storage portion 70 illustrated in FIG. 13. For example, ferric chloride etchant, such as ferric chloride aqueous solution, or copper chloride etchant, such as copper chloride aqueous solution, can be used as the etchant.

Etching may be carried out on the first material surface Ma and the second material surface Mb of the metal sheet M at the same time. However, the etching process is not limited thereto. Etching of the first material surface Ma and the second material surface Mb may be carried out as separate processes. The vapor flow channel portion 50, the liquid flow channel portion 60, and the liquid storage portion 70 may be formed by etching at the same time or in separate processes.

In the etching process, the first material surface Ma and the second material surface Mb of the metal sheet M are etched to obtain the predetermined outline contour shape, as illustrated in FIG. 6 and FIG. 7. That is, the edges of the wick sheet 30 are formed.

In this way, the wick sheet 30 according to the present embodiment is obtained.

In a joining process carried out after the process of producing the wick sheet 30, the lower sheet 10, the upper sheet 20, and the wick sheet 30 are joined together, as illustrated in FIG. 14. The lower sheet 10 and the upper sheet 20 may be made of a rolled material having a desired planar shape and a desired thickness.

More specifically, first, the lower sheet 10, the wick sheet 30, and the upper sheet 20 are stacked in this order. In this case, the first body surface 31a of the wick sheet 30 is stacked on the second lower sheet surface 10b of the lower sheet 10, and the first upper sheet surface 20a of the upper sheet 20 is stacked on the second body surface 31b of the wick sheet 30. At this time, the alignment holes 12 of the lower sheet 10, alignment holes 35 of the wick sheet 30, and alignment holes 22 of the upper sheet 20 are used to align the sheets 10, 20, and 30.

Subsequently, the lower sheet 10, wick sheet 30, and upper sheet 20 are temporarily bonded together. For example, spot resistance welding may be used to temporarily bond the sheets 10, 20, and 30 together. Alternatively, laser welding may be used to temporarily bond the sheets 10, 20, and 30 together.

Subsequently, the lower sheet 10, the wick sheet 30, and the upper sheet 20 are permanently bonded by diffusion bonding. Diffusion bonding is a technique of bonding by pressurizing and heating the lower sheet 10, the wick sheet 30, and the upper sheet 20 in the stacking direction in a controlled atmosphere, such as vacuum or inert gas, and using the diffusion of atoms that occurs on the bonding surface. During pressurization, the lower sheet 10 is closely contacted with the wick sheet 30, and the wick sheet 30 is closely contact with the upper sheet 20. In diffusion bonding, the materials of the sheets 10, 20, and 30 are heated to a temperature close to, but lower than, the melting point, thus avoiding melting and deformation of the sheets 10, 20, and 30. More specifically, the first body surface 31a at the frame body portion 32 and each of the land portions 33 of the wick sheet 30 are diffusion bonded to the second lower sheet surface 10b of the lower sheet 10. In addition, the second body surface 31b at the frame body portion 32 and each of the land portions 33 of the wick sheet 30 are diffusion bonded to the first upper sheet surface 20a of the upper sheet 20. In this way, the sheets 10, 20, and 30 are diffusion bonded together to form the sealed space 3 having the vapor flow channel portion 50, the liquid flow channel portion 60, and the liquid storage portion 70 between the lower sheet 10 and the upper sheet 20. In this stage, the above-described injection flow channel 37 is not sealed in the sealed space 3. In the above-described injection portion 4, the lower injection protrusion 11 of the lower sheet 10 and the wick sheet injection protrusion 36 of the wick sheet 30 are diffusion bonded. In addition, the wick sheet injection protrusion 36 is diffusion bonded to the upper injection protrusion 21 of the upper sheet 20.

After the joining process, the working liquid 2b is injected into the sealed space 3 through the injection portion 4. At this time, the injected volume of the working liquid 2b may be greater than the total volume of a space formed by the liquid flow channel mainstream grooves 61 and the liquid flow channel communication grooves 65 of the liquid flow channel portion 60.

Subsequently, the injection flow channel 37 described above is sealed. For example, a laser beam may be emitted to the injection portion 4 to partially melt the injection portion 4 and seal the injection flow channel 37. In this manner, communication of the sealed space 3 with the outside is blocked, achieving a sealed space 3 that is filled with the working liquid 2b. Thus, leakage of the working liquid 2b in the sealed space 3 to the outside is prevented. Note that to seal the injection flow channel 37, the injection portion 4 may be caulked (or pressed and plastically deformed) or brazed.

As described above, the vapor chamber 1 according to the present embodiment is obtained.

A method for operating the vapor chamber 1, that is, a method for cooling the electronic device D is described below.

The vapor chamber 1 obtained as described above is mounted in the housing H of a mobile terminal or the like. An electronic device D (e.g., a CPU), which is a device to be cooled, is mounted on the second upper sheet surface 20b of the upper sheet 20. The working liquid 2b in the sealed space 3 adheres to the wall surface of the sealed space 3 due to its surface tension. More specifically, the working liquid 2b adheres to the wall surface 53a of the lower vapor flow channel recess 53, the wall surface 54a of the upper vapor flow channel recess 54, and the wall surface 62 of the liquid flow channel mainstream grooves 61 and a wall surface of the liquid flow channel communication grooves 65 of the liquid flow channel portion 60. In addition, the working liquid 2b can adhere to portions of the second lower sheet surface 10b of the lower sheet 10 that are exposed to the lower vapor flow channel recess 53. Furthermore, the working liquid 2b can adhere to portions of the first upper sheet surface 20a of the upper sheet 20 that are exposed to the upper vapor flow channel recess 54, the liquid flow channel mainstream grooves 61, and the liquid flow channel communication grooves 65.

At this time, if the electronic device D generates heat, the working liquid 2b located in the evaporation region SR (refer to FIGS. 6 and 7) receives the heat from the electronic device D. The received heat is absorbed in the form of latent heat, and the working liquid 2b evaporates and produce the working vapor 2a. Most of the generated working vapor 2a diffuses in the lower vapor flow channel recesses 53 and upper vapor flow channel recesses 54, which constitute the sealed space 3 (refer to solid arrows in FIG. 6). The working vapor 2a in each of the vapor flow channel recesses 53 and 54 leaves the evaporation region SR. Most of the working vapor 2a is delivered to the condensation region CR where the temperature is relatively low. In FIGS. 6 and 7, most of the working vapor 2a is delivered to the right portion of the vapor flow channel portion 50. In the condensation region CR, the working vapor 2a dissipates heat mainly to the lower sheet 10 and is cooled. The heat received by the lower sheet 10 from the working vapor 2a is transferred to the outside air via the housing member Ha (refer to FIG. 3).

The working vapor 2a dissipates heat to the lower sheet 10 in the condensation region CR. As a result, the working vapor 2a loses the latent heat absorbed in the evaporation region SR and condenses and, thus, the working fluid 2b is generated. The generated working liquid 2b adheres to the wall surface 53a of the lower vapor flow channel recess 53, the wall surface 54a of the vapor flow channel recess 54, the second lower sheet surface 10b of the lower sheet 10, and the first upper sheet surface 20a of the upper sheet 20. At this time, the working liquid 2b continues to evaporate in the evaporation region SR. Accordingly, the working liquid 2b in a region (i.e., the condensation region CR) of the liquid flow channel portion 60 other than the evaporation region SR is delivered toward the evaporation region SR by the capillary action in each of the liquid flow channel mainstream grooves 61 (refer to dashed arrows in FIG. 6). As a result, the working liquid 2b that adhered to each of the walls 53a and 54a, the second lower sheet surface 10b, and the first upper sheet surface 20a moves to the liquid flow channel portion 60. At this time, the working liquid 2b passes through the liquid flow channel communication grooves 65 and enters the liquid flow channel mainstream grooves 61. In this way, the liquid flow channel mainstream grooves 61 and the liquid flow channel communication grooves 65 are filled with the working liquid 2b. Accordingly, the loaded working liquid 2b is propelled toward the evaporation region SR by capillary action of each of the liquid flow channel mainstream grooves 61. In this way, the working liquid 2b is smoothly delivered toward the evaporation region SR.

In the liquid flow channel portion 60, each of the liquid flow channel mainstream grooves 61 communicates with another neighboring liquid flow channel mainstream groove 61 via the corresponding fluid flow channel communication groove 65. This inhibits dry-out from occurring in the liquid flow channel mainstream grooves 61 due to the working liquid 2b flowing back and forth between two neighboring liquid flow channel mainstream grooves 61. As a result, capillary action of the working liquid 2b occurs in each of the liquid flow channel mainstream grooves 61 and, thus, the working liquid 2b is smoothly delivered toward the evaporation region SR.

Note that part of the working liquid 2b condensed in the condensation region CR is delivered to the liquid storage portion 70 provided on the first body surface 31a of the wick sheet 30, instead of the liquid flow channel portion 60. More specifically, part of the working liquid 2b that adhered to each of the walls 53a and 54a, the second lower sheet surface 10b, and the first upper sheet surface 20a passes through the liquid storage communication groove 75 and enters the liquid storage mainstream groove 71. In this way, each of the liquid storage mainstream grooves 71 and each of the liquid storage communication grooves 75 is filled with the working liquid 2b. As a result, the working liquid 2b is propelled by the capillary action in each of the liquid storage mainstream grooves 71 and each of the liquid storage communication grooves 75 and, thus, moves smoothly toward the inside of the liquid storage portion 70.

The working liquid 2b that reaches the evaporation region SR by the liquid flow channel portion 60 receives heat from the electronic device D again and evaporates. The working vapor 2a that evaporated from the working liquid 2b moves through the liquid flow channel communication grooves 65 in the evaporation region SR to the lower vapor flow channel recess 53 and the upper vapor flow channel recess 54 each having a large flow channel cross-sectional area. Thereafter, the working vapor 2a disperses in each of the vapor flow channel recesses 53 and 54. In addition, the liquid storage portion 70 is disposed in the evaporation region SR. This causes the working liquid 2b in the liquid storage portion 70 to evaporate in the same way and disperse in each of the vapor flow channel recesses 53 and 54. In this way, the working fluids 2a and 2b reflux in the sealed space 3 while repeating the phase change, that is, evaporation and condensation. Thus, the heat of the electronic device D is delivered and dissipated. As a result, the electronic device D is cooled.

While the electronic device D stops generating heat, the working liquid 2b in the evaporation region SR does not evaporate. The liquid flow channel mainstream grooves 61 and the liquid flow channel communication grooves 65 of the liquid flow channel portion 60 are filled with the working liquid 2b and the working liquid 2b remains there. Therefore, the working liquid 2b in the condensation region CR remains without being delivered toward the evaporation region SR. Part of the working liquid 2b in the liquid flow channel portion 60 flows on the wall surface 53a of the lower vapor flow channel recess 53 or the wall surface 54a of the upper vapor flow channel recess 54 and moves to the liquid storage mainstream grooves 71 and the liquid storage communication grooves 75 in the liquid storage portion 70. As a result, the grooves 71 and 75 are filled with the working liquid 2b, which remains there. If the volume of the working liquid 2b enclosed in the sealed space 3 is greater than the total volume of the space formed by the liquid flow channel mainstream grooves 61 and the liquid flow channel communication grooves 65, part of the working liquid 2b tends to be filled with the liquid storage mainstream grooves 71 and the liquid storage communication grooves 75. Accordingly, the working liquid 2b can be dispersed and remain in the liquid storage portion 70 in addition to the liquid flow channel portion 60.

At this time, even when the electronic apparatus E having the vapor chamber 1 mounted therein is placed in a temperature environment lower than the freezing point of the working fluids 2a and 2b and, thus, the working liquid 2b in the liquid flow channel portion 60 freezes and expands, the force of expansion of the working fluids 2a and 2b is decreased. This inhibits the upper sheet 20 from being deformed by the force of expansion. As a result, a decrease in the flatness of the second upper sheet surface 20b of the upper sheet 20 having the electronic device D mounted thereon can be reduced, and formation of a gap between the second upper sheet surface 20b and the electronic device D can be inhibited. In this case, blockage of heat transfer from the electronic device D can be inhibited, and a decrease in the performance of the vapor chamber 1 can be reduced. Similarly, even when the working liquid 2b in the liquid storage portion 70 freezes and expands, the force of expansion is decreased. This inhibits the lower sheet 10 from being deformed by the force of expansion. As a result, a decrease in the flatness of the first lower sheet surface 10a of the lower sheet 10 can be reduced.

As described above, according to the present embodiment, the liquid flow channel portion 60 is provided on the second body surface 31b of the sheet body 31 of the wick sheet 30, and the liquid storage portion 70 is provided on the first body surface 31a positioned on the opposite side from the second body surface 31b. The flow channel cross-sectional area of the liquid storage mainstream groove 71 of the liquid storage portion 70 is greater than that of the liquid flow channel mainstream groove 61 of the liquid flow channel portion 60. This allows the working liquid 2b to be distributed and stored in the liquid storage portion 70 in addition to the liquid flow channel portion 60 while the electronic device D stops generating heat. Therefore, even when the working liquid 2b in the liquid flow channel portion 60 freezes and expands in a temperature environment lower than the freezing point of the working liquid 2b, the force of expansion exerted on the upper sheet 20 can be reduced. In this case, deformation of the upper sheet 20 can be inhibited. In addition, even when the working liquid 2b in the liquid storage portion 70 freezes and expands, the force of expansion exerted on the lower sheet 10 can be reduced. In this case, deformation of the lower sheet 10 can be inhibited. As a result, deformation of the vapor chamber 1 can be inhibited, and a decrease in the performance of the vapor chamber 1 can be reduced. In addition, while the electronic device D is generating heat, the working liquid 2b in the liquid storage portion 70 can evaporate due to the heat received from the electronic device D. Accordingly, the heat generated by the electronic device D can be dispersed more, and the efficiency for cooling the electronic device D can be increased.

In addition, according to the present embodiment, the liquid flow channel portion 60 is provided on the second body surface 31b of the sheet body 31 of the wick sheet 30, and the liquid storage portion 70 is provided on the first body surface 31a positioned on the opposite side from the second body surface 31b. The flow channel cross-sectional area of the liquid storage mainstream groove 71 of the liquid storage portion 70 is greater than that of the liquid flow channel mainstream grooves 61 of the liquid flow channel portion 60. This allows the capillary force that acts on the working liquid 2b in the liquid storage mainstream groove 71 to be smaller than the capillary force that acts on the working liquid 2b in the liquid flow channel mainstream grooves 61. While the electronic device D is generating heat, the amount of movement of the working liquid 2b delivered to the liquid storage portion 70 can be reduced. Therefore, a decrease in the function of delivering the working liquid 2b to the evaporation region SR can be reduced, and a decrease in heat transport efficiency can be reduced. In addition, as described above, by making the flow channel cross-sectional area of the liquid storage mainstream groove 71 greater than that of the liquid flow channel mainstream groove 61, the total volume of the spaces formed by the liquid storage mainstream grooves 71 can be increased. As a result, the stored volume of the working liquid 2b in the liquid storage portion 70 can be increased while the electronic device D stops generating heat.

According to the present embodiment, the width of the liquid storage mainstream groove 71 is greater than the width of the liquid flow channel mainstream groove 61. This allows the flow channel cross-sectional area of the liquid storage mainstream groove 71 to be greater than that of the liquid flow channel mainstream groove 61. As a result, a decrease in the heat transport efficiency can be reduced, and the stored volume of the working liquid 2b can be increased.

In addition, according to the present embodiment, the depth of the liquid storage mainstream groove 71 is greater than the depth of the liquid flow channel mainstream groove 61. This allows the flow channel cross-sectional area of the liquid storage mainstream groove 71 to be greater than that of the liquid flow channel mainstream groove 61. As a result, a decrease in the heat transport efficiency can be reduced, and the stored volume of the working liquid 2b can be increased.

In addition, according to the present embodiment, the liquid flow channel portion 60 and the liquid storage portion 70 are provided in each of the land portions 33, and the number of liquid storage mainstream grooves 71 provided in the land portion 33 is less than the number of liquid flow channel mainstream grooves 61 provided in the land portion 33. This allows the flow channel cross-sectional area of the liquid storage mainstream groove 71 to be greater than that of the liquid flow channel mainstream groove 61. As a result, a decrease in the heat transport efficiency can be reduced, and the stored volume of the working liquid 2b can be increased.

In addition, according to the present embodiment, the liquid flow channel portion 60 through which the working liquid 2b passes is provided on the second body surface 31b of the sheet body 31 of the wick sheet 30, and the liquid storage portion 70 is provided on the first body surface 31a provided on the opposite side from the second body surface 31b. The liquid storage portion 70 is disposed in the evaporation region SR in plan view. This allows the working liquid 2b to be distributed and stored in the liquid storage portion 70 in addition to the liquid flow channel portion 60 while the electronic device D stops generating heat. Thus, even when the working liquid 2b in the liquid flow channel portion 60 freezes and expands in a temperature environment lower than the freezing point of the working liquid 2b, the force of expansion exerted on the upper sheet 20 can be decreased. In this case, deformation of the upper sheet 20 can be inhibited. In addition, even when the working liquid 2b in the liquid storage portion 70 freezes and expands, the force of expansion exerted on the lower sheet 10 can be decreased. In this case, deformation of the lower sheet 10 can be inhibited. As a result, deformation of the vapor chamber 1 can be inhibited, and a decrease in the performance of the vapor chamber 1 can be reduced. In addition, while the electronic device D is generating heat, the working liquid 2b in the liquid storage portion 70 can be evaporated by the heat received from the electronic device D. As a result, the heat of the electronic device D can be dissipated more, and the efficiency for cooling the electronic device D can be increased.

In addition, according to the present embodiment, a plurality of convex portions 74 protruding from the sheet body 31 of the wick sheet 30 and being in contact with the lower sheet 10 are provided in the liquid storage portion 70. The gap between a pair of the convex portions 74 (corresponding to the width w6 of the liquid storage mainstream groove 71) neighboring each other is greater than the width of the liquid flow channel mainstream groove 61 of the liquid flow channel portion 60. This allows the capillary force that acts on the working liquid 2b in the liquid storage portion 70 to be smaller than the capillary force that acts on the working liquid 2b in the liquid flow channel portion 60 (in the liquid flow channel mainstream groove 61). While the electronic device D is generating heat, the amount of movement of the working liquid 2b to the liquid storage portion 70 can be reduced. Therefore, a decrease in the function of delivering the working liquid 2b to the evaporation region SR can be reduced, and the decrease in heat transport efficiency can be reduced. In addition, as described above, by making the gap between the convex portions 74 greater than the width of the liquid flow channel mainstream groove 61, the total volume of spaces formed by the liquid storage mainstream grooves 71 and the liquid storage communication grooves 75 of the liquid storage portion 70 can be increased. As a result, the stored volume of the working liquid 2b in the liquid storage portion 70 can be increased while the electronic device D stops generating heat.

In addition, according to the present embodiment, the liquid storage portion 70 has the liquid storage mainstream grooves 71 each provided between two neighboring convex portions 74 in the Y direction that is orthogonal to the X direction in which the liquid flow channel mainstream grooves 61 of the liquid flow channel portion 60 extend. The liquid storage mainstream grooves 71 extend in the X direction. After the electronic device D stops generating heat, the working liquid 2b flows substantially in the X direction from the condensation region CR to the evaporation region SR, and the working liquid 2b that reaches the liquid storage portion 70 can easily enter the liquid storage mainstream grooves 71. Thereafter, the working liquid 2b can flow smoothly in the liquid storage mainstream grooves 71 in the X direction and can easily reach the edge of the liquid storage portion 70 closer to the evaporation area SR. As a result, the working liquid 2b can be rapidly drawn into the liquid storage portion 70, and the stored volume of the working liquid 2b can be rapidly increased. If the ambient temperature of the vapor chamber 1 rapidly drops, the working liquid 2b can be rapidly drawn into the liquid storage portion 70. Therefore, the force of expansion exerted on the upper sheet 20 and the lower sheet 10 can be effectively decreased when the working liquid 2b freezes. In this manner, deformation of the vapor chamber 1 can be effectively inhibited.

In addition, according to the present embodiment, the gap between a pair of the convex portions 74 neighboring each other is smaller than the gap between a pair of the land portions 33 (corresponding to the width w2 of the penetration portion 34) neighboring each other. This allows the capillary force to act on the working liquid 2b in the liquid storage portion 70. Therefore, the working liquid 2b can be drawn into the liquid storage portion 70, and the working liquid 2b can be stored in the liquid storage portion 70 while the electronic device D stops generating heat.

In addition, according to the present embodiment, the liquid storage portion 70 is provided on the first body surface 31a of each of the land portions 33. This allows the working liquid 2b to be distributed and stored in the liquid storage portions 70. As a result, even when the working liquid 2*b* in the liquid flow channel portion 60 freezes and expands in a temperature environment lower than the freezing point of the working liquid 2*b*, deformation of the upper sheet 20 can be inhibited more. In addition, even when the working liquid 2*b* in the liquid storage portion 70 freezes and expands, deformation of the lower sheet 10 can be inhibited more.

In addition, according to the present embodiment, the liquid storage portion 70 is disposed on one side of the land portion 33 in the X direction. This allows the liquid storage portion 70 to be disposed in the evaporation region SR when the evaporation region SR is formed on one side of the vapor chamber 1 in the X direction. Therefore, the working liquid 2*b* in the liquid storage portion 70 can evaporate while the electronic device D is generating heat, and the heat from the electronic device D can be dissipated more. As a result, the efficiency for cooling the electronic device D can be increased.

(First Modification)

The above embodiment has been described with reference to an example in which part of the working liquid 2*b* in the liquid flow channel portion 60 is moved to and stored in the liquid storage portion 70 while the electronic device D stops generating heat. In the example, the working liquid 2*b* flows on the wall surface 53*a* of the lower vapor flow channel recess 53 or the wall surface 54*a* of the upper vapor flow channel recess 54. However, the configuration is not limited thereto. The sheet body 31 may be provided with a plurality of communication portions 80 each enabling the liquid flow channel portion 60 to communicate with the liquid storage portion 70. The communication portions 80 may be located inside of the evaporation region SR. The communication portions 80 may be located in a region that overlaps the electronic device D in plan view.

Figure 15:
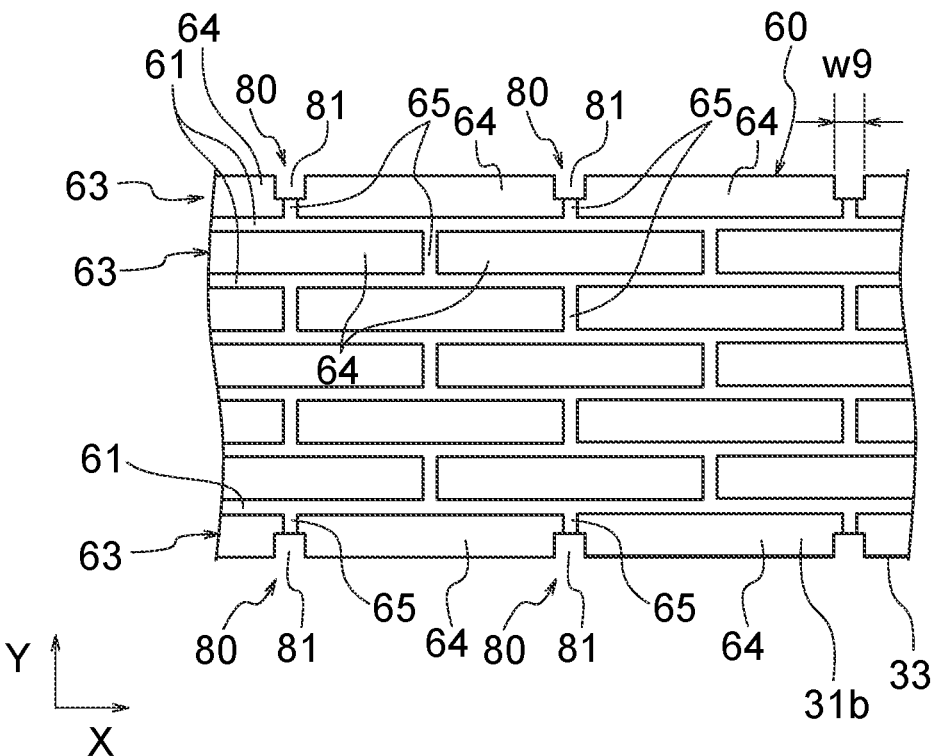
FIG. 15 is a partially enlarged top view of a liquid flow channel portion according to a first modification.
Figure 16:
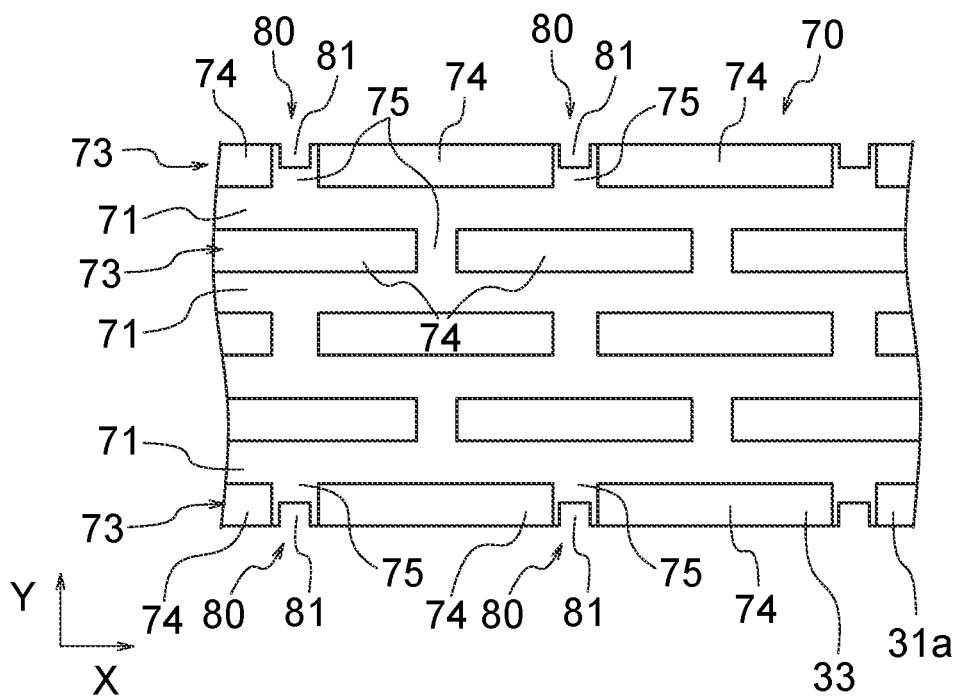
FIG. 16 is a partially enlarged bottom view of a liquid storage portion according to the first modification.

For example, as in the first modification illustrated in FIGS. 15 and 16, the communication portion 80 may include communication recesses 81 provided in the wall of the vapor flow channel portion 50. The communication recesses 81 may extend from the liquid flow channel portion 60 to the liquid storage portion 70. According to the first modification illustrated in FIGS. 15 and 16, the communication recesses 81 are provided so as to extend in the Z direction along the walls 53*a* of the lower vapor flow channel recesses 53 and the walls 54*a* of the upper vapor flow channel recesses 54.

The communication recess 81 may extend to at least one of the liquid flow channel communication groove 65 of the liquid flow channel portion 60 and the liquid storage communication groove 75 of the liquid storage portion 70. According to the first modification illustrated in FIGS. 15 and 16, one end of the communication recess 81 extends to the liquid flow channel communication groove 65, and the other end of the communication recess 81 extends to the liquid storage communication groove 75. Note that the communication recess 81 does not necessarily have to communicate with the liquid flow channel communication groove 65 or the liquid storage communication groove 75. Furthermore, the communication recess 81 does not necessarily have to communicate with both the liquid flow channel communication groove 65 and the liquid storage communication groove 75. The flow passage cross-sectional shape of the communication recess 81 may be rectangular, as illustrated in FIGS. 15 and 16. Alternatively, the flow passage cross-sectional shape may be formed into a curved shape, such as a semicircle or semi-ellipsoid. The flow passage cross-sectional shape of the communication recess 81 corresponds to the shape in plan view.

As illustrated in FIG. 15, a width w9 of the communication recess 81 may be greater than the width w4 of the liquid flow channel communication groove 65 (refer to FIG. 9). The width w9 corresponds to the dimension in the X direction. This allows the capillary force that acts on the working liquid 2*b* in the communication recess 81 to be smaller than the capillary force that acts on the working liquid 2*b* in the liquid flow channel communication groove 65. In this case, the working liquid 2*b* can be inhibited from remaining in the communication recess 81. In addition, in this case, the communication recess 81 is formed so as to notch the convex portion 64. In addition, the width w9 of the communication recess 81 may be less than the width w7 of the liquid storage communication groove 75 (refer to FIG. 10). This allows capillary force to act on the working liquid 2*b* in the communication recess 81 and, thus, allows the working liquid 2*b* to move to the liquid storage portion 70. The width w9 of the communication recess 81 may be, for example, 20 μm to 300 μm. Note that the width w9 of the communication recess 81 refers to the dimension at the second body surface 31*b* of the wick sheet 30.

As described above, according to the first modification, while the electronic device D stops generating heat, part of the working liquid 2*b* in the liquid flow channel portion 60 can move to the liquid storage portion 70 through the communication portion 80. This increases the amount of movement of the working liquid 2*b* delivered from the liquid flow channel portion 60 to the liquid storage portion 70, resulting in an increase in the stored volume of working liquid 2*b* in the liquid storage portion 70.

In addition, according to the first modification, the communication portion 80 has the communication recess 81 provided on the wall of the vapor flow channel portion 50, and the communication recess 81 extends from the liquid flow channel portion 60 to the liquid storage portion 70. This can reduce the flow resistance of the working liquid 2*b* flowing from the liquid flow channel portion 60 to the liquid storage portion 70. As a result, the amount of working liquid 2*b* remaining in the liquid flow channel portion 60 can be reduced. Even when the working liquid 2*b* in the liquid flow channel portion 60 freezes and expands, the force of expansion can be decreased. In addition, the force of expansion can be decreased even when the working liquid 2*b* in the liquid storage portion 70 freezes and expands. As a result, the upper sheet 20 and lower sheet 10 can be inhibited from being deformed by the force of expansion. Furthermore, according to the first modification, the flow resistance of the working liquid 2*b* flowing from the liquid flow channel portion 60 to the liquid storage portion 70 can be reduced more, since the communication recess 81 extends to the liquid flow channel communication groove 65 and the liquid storage communication groove 75.

(Second Modification)

Figure 17:
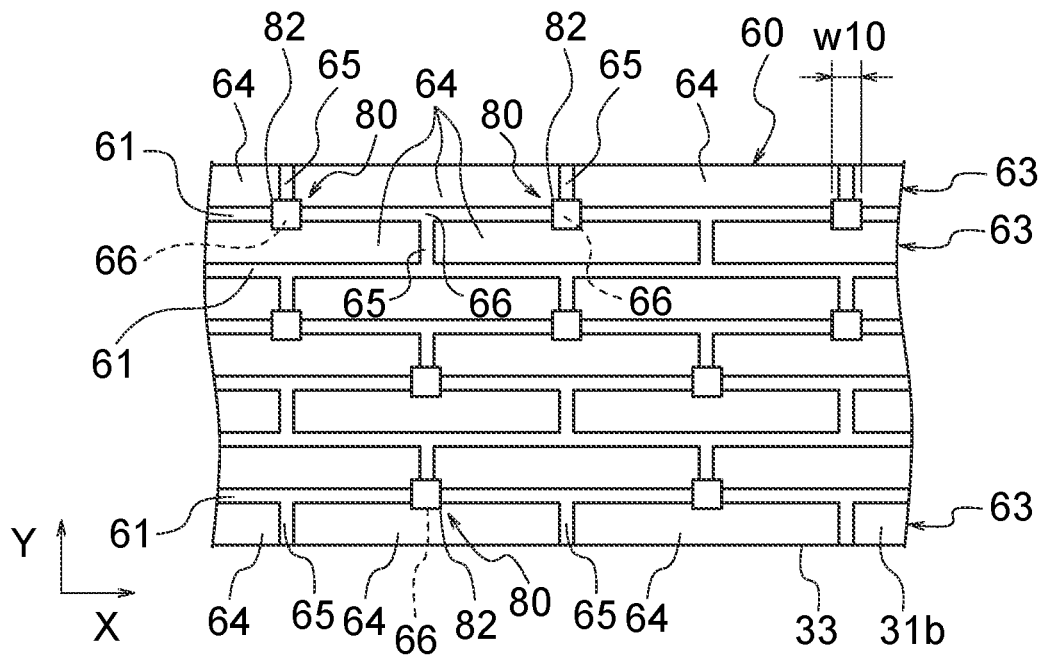
FIG. 17 is a partially enlarged top view of a liquid flow channel portion according to a second modification.
Figure 18:
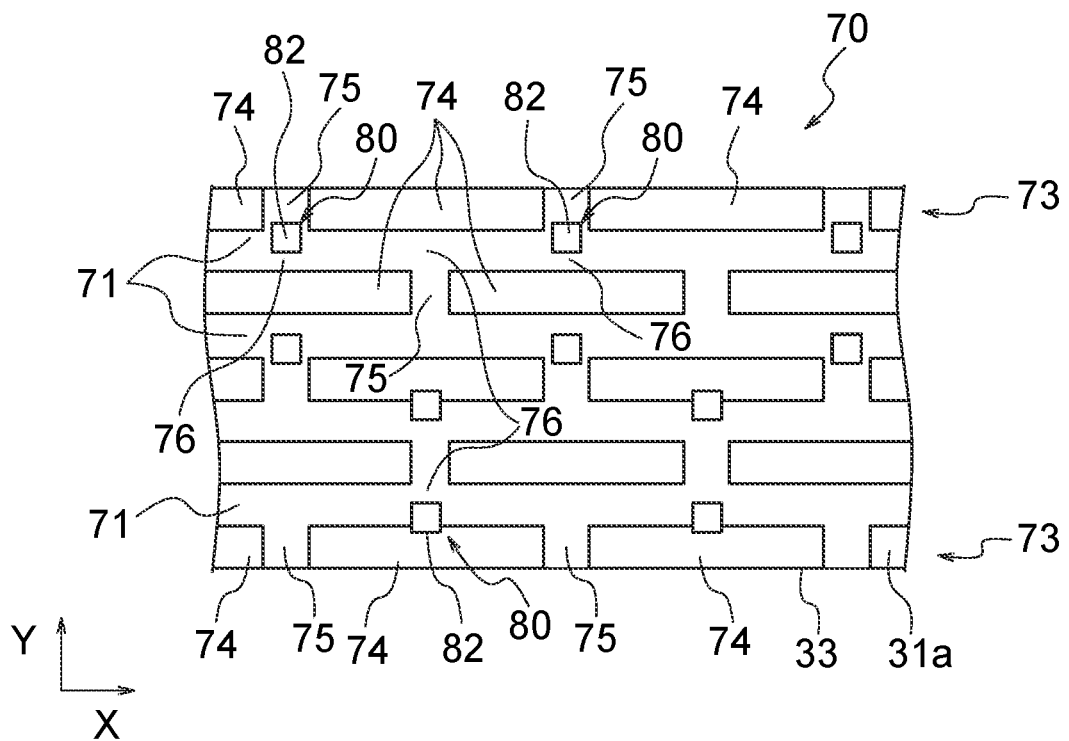
FIG. 18 is a partially enlarged bottom view of a liquid storage portion according to the second modification.

Unlike the first modification illustrated in FIGS. 15 and 16, as illustrated in a second modification illustrated in FIGS. 17 and 18, the communication portion 80 may include a through-hole 82 that penetrates the sheet body 31 and extends from the liquid flow channel portion 60 to the liquid storage portion 70. According to the second modification illustrated in FIGS. 17 and 18, the through-hole 82 is located inside the land portion 33 in plan view, not on the wall surface 53*a* of the lower vapor flow channel recess 53 or the wall surface 54*a* of the upper vapor flow channel recess 54. The through-hole 82 is formed at such a position that it is not cut out by the wall surface 53*a* of the lower vapor flow channel recess 53 and the wall surface 54*a* of the upper vapor flow channel recess 54. That is, the through-hole 82 has a closed contour shape in plan view. In FIGS. 17 and 18, an example in which the through-hole 82 is formed in a rectangular shape is illustrated. However, the planar shape of the through-hole 82 may be any shape, such as a circular shape.

The through-hole 82 may extend to at least one of the liquid flow channel intersection portion 66 of the liquid flow channel portion 60 and the liquid storage intersection portion 76 of the liquid storage portion 70. According to the second modification illustrated in FIGS. 17 and 18, one end of the through-hole 82 extends to the liquid flow channel intersection portion 66 and is located at the liquid flow channel intersection portion 66 described above. The other end of the through-hole 82 extends to the liquid storage intersection portion 76. Note that the through-hole 82 does not necessarily have to communicate with the liquid flow channel intersection portion 66 as long as it communicates with the liquid flow channel mainstream groove 61 or the liquid flow channel communication groove 65. Alternatively, the through-hole 82 does not have to communicate with the liquid storage intersection portion 76, as long as it communicates with the liquid storage mainstream groove 71 or the liquid storage communication groove 75. The flow passage cross-sectional shape of the through-hole 82 may be rectangular, as illustrated in FIGS. 17 and 18, or may be a curved shape, such as circular shape or elliptical shape. The flow passage cross-sectional shape of the through-hole 82 corresponds to the shape in plan view.

As illustrated in FIG. 17, a width w10 of the through-hole 82 may be greater than the width w4 of the liquid flow channel communication groove 65 (refer to FIG. 9). The width w10 corresponds to the dimension in the X direction. This allows the capillary force that acts on the working liquid 2b in the through-hole 82 to be smaller than the capillary force that acts on the working liquid 2b in the liquid flow channel communication groove 65. In this case, the working liquid 2b can be inhibited from remaining in the through-hole 82. In this case, the through-hole 82 is formed so as to notch the convex portion 64. In addition, the width w10 of the through-hole 82 may be less than the width w7 of the liquid storage communication groove 75 (refer to FIG. 10). This allows capillary force to act on the working liquid 2b in the through-hole 82 and, thus, allows the working liquid 2b to move to the liquid storage portion 70. The width w10 of the through-hole 82 may be, for example, 10 μm to 100 μm. Note that the width w10 of the through-hole 82 refers to the dimension at the second body surface 31b of the wick sheet 30. FIG. 18 illustrates an example in which the through-hole 82 is formed to protrude from the liquid storage intersection portion 76 due to the relationship between the alignment pitch in the Y direction of the liquid flow channel mainstream grooves 61 and the alignment pitch in the Y direction of the liquid storage mainstream grooves 71. However, the configuration is not limited thereto. The through-hole 82 may not protrude from the liquid storage intersection portion 76, depending on the alignment pitches of the grooves 61 and 71.

As described above, according to the second modification, while the electronic device D stops generating heat, part of the working liquid 2b in the liquid flow channel portion 60 can move to the liquid storage portion 70 through the through-hole 82. This increases the amount of movement of the working liquid 2b delivered from the liquid flow channel portion 60 to the liquid storage portion 70, resulting in an increase in the stored volume of working liquid 2b in the liquid storage portion 70. In particular, since the through-hole 82 is located inside of the land portion 33 in plan view, the flow resistance of the working liquid 2b from the liquid flow channel portion 60 to the liquid storage portion 70 can be decreased. As a result, the amount of the working liquid 2b remaining in the liquid flow channel portion 60 can be reduced. Even when the working liquid 2b in the liquid flow channel portion 60 freezes and expands, the force of expansion can be decreased. As a result, the upper sheet 20 can be inhibited from being deformed by the force of expansion. In addition, even when the working liquid 2b in the liquid storage portion 70 freezes and expands, the force of expansion can be decreased. As a result, the lower sheet 10 can be inhibited from being deformed by the force of expansion.

According to the second modification, the communication portion 80 includes a through-hole 82 that penetrates the sheet body 31 and extends from the liquid flow channel portion 60 to the liquid storage portion 70. This can further reduce the flow resistance of the working liquid 2b from the liquid flow channel portion 60 to the liquid storage portion 70. As a result, the amount of working liquid 2b remaining in the liquid flow channel portion 60 can be reduced more. Even when the working liquid 2b in the liquid flow channel portion 60 freezes and expands, the force of expansion can be decreased more. Furthermore, according to the second modification, the through-hole 82 extends to the liquid flow channel intersection portion 66 and the liquid storage intersection portion 76, resulting in a further decrease in the flow resistance of the working liquid 2b from the liquid flow channel portion 60 to the liquid storage portion 70.

(Third Modification)

The present embodiment has been described above with reference to an example in which the convex portion 74 provided in the liquid storage portion 70 is formed in a rectangular shape in plan view such that the X direction is the longitudinal direction. However, the configuration is not limited thereto, and the convex portion 74 may have any planar shape.

Figure 19:
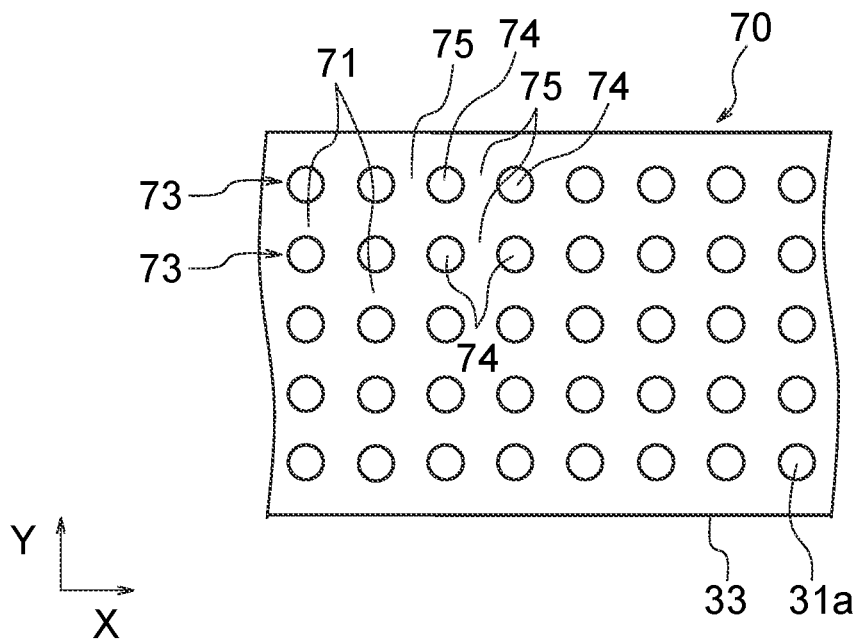
FIG. 19 is a partially enlarged bottom view of a liquid storage portion according to a third modification.

For example, as illustrated in FIG. 19, the convex portion 74 may be formed in a circular shape in plan view or may be formed in an elliptical shape (not illustrated). In addition, in the example illustrated in FIG. 19, an example in which the convex portions 74 are arranged in parallel is illustrated. More specifically, the convex portions 74 in two neighboring convex-portion rows 73 in the Y direction are also aligned in the X direction.

Figure 20:
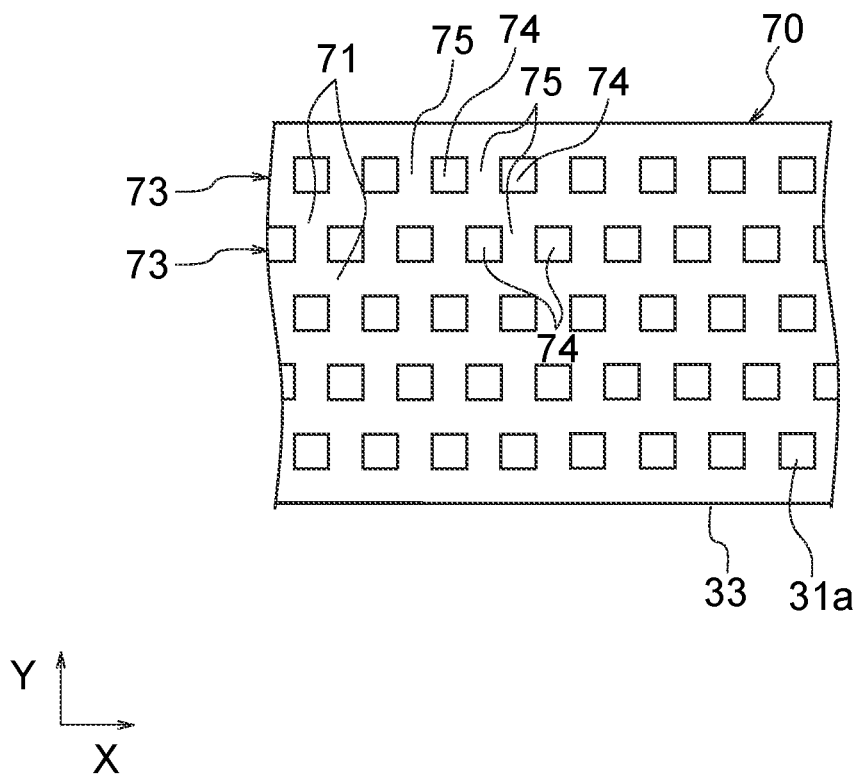
FIG. 20 is a partially enlarged bottom view of a liquid storage portion according to the third modification.

In addition, for example, as illustrated in FIG. 20, each of the convex portions 74 may be formed in a square shape in plan view. In the example illustrated in FIG. 20, the convex portions 74 are arranged in a staggered manner. However, the convex portions 74 may be arranged in parallel.

Figure 21:
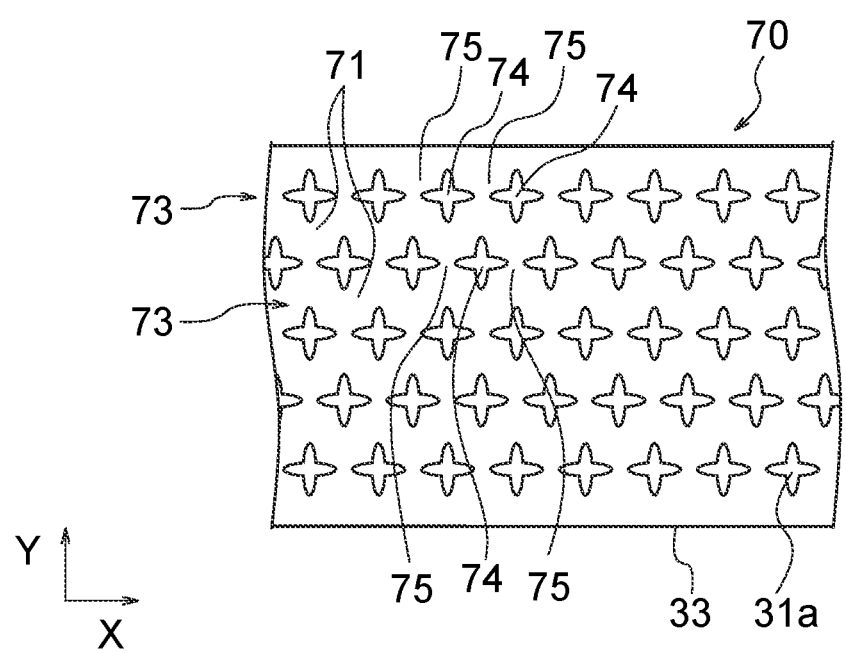
FIG. 21 is a partially enlarged bottom view of a liquid storage portion according to the third modification.

In addition, for example, as illustrated in FIG. 21, the convex portion 74 may be formed in the shape of a cross in plan view. In the example illustrated in FIG. 21, the planar shape of the convex portion 74 is formed in the shape of a rounded cross. In addition, in the example illustrated in FIG. 21, the convex portions 74 are arranged in a staggered manner. However, the convex portions 74 may be arranged in parallel. Alternatively, the convex portion 74 may be formed in a shape of a star polygon in plan view.

(Fourth Modification)

The present embodiment has been described above with reference to an example in which the liquid storage portion 70 is provided on the first body surface 31a of each of the land portions 33 of the wick sheet 30. However, the configuration is not limited thereto. The liquid storage portions 70 need not be provided in all of the land portions 33. For example, the liquid storage portion 70 may be provided in any one of the land portions 33 only or in some land portions 33. For example, if the planar shape of the electronic device D is small, the liquid storage portion 70 may be selectively provided in the land portions 33 in accordance with the region to be covered by the electronic device D. The same applies to the case where the vapor chamber 1 does not have a simple rectangular shape.

(Fifth Modification)

Figure 22:
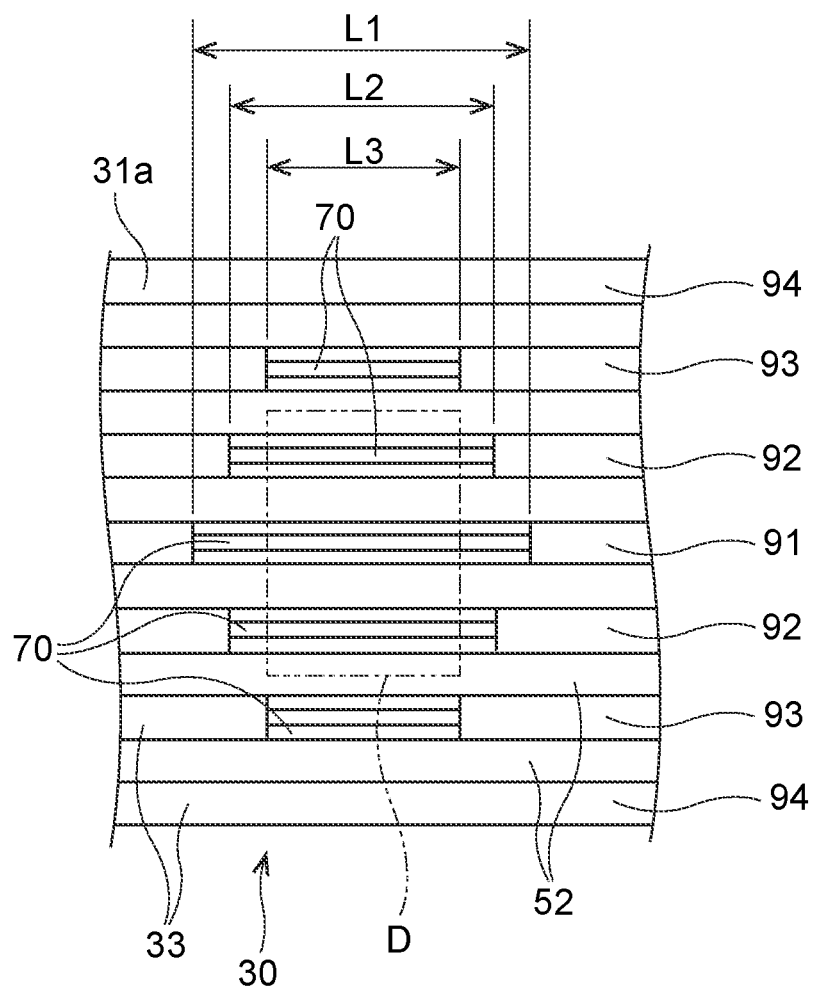
FIG. 22 is a bottom view of the wick sheet illustrated in FIG. 3 according to a fifth modification.

As illustrated in FIG. 22, the liquid storage portion 70 may be disposed in a region of the vapor chamber 1 that overlaps the electronic device D in plan view.

In the example illustrated in FIG. 22, one or more of the plurality of land portions 33 are provided with the liquid storage portions 70. The electronic device D overlaps a plurality of the land portions 33. The electronic device D is disposed across the plurality of land portions 33. In FIG. 22, seven land portions 33 are illustrated, and electronic device D overlaps three of the land portions 33. The electronic device D does not overlap the remaining four land portions 33. The three land portions 33 that overlap the electronic device D are referred to as overlapped land portions 91 and 92. Among the four land portions 33 that do not overlap the electronic device D, the land portions 33 that neighbor the overlapped land portions 91 and 92 are referred to as first non-overlapped land portions 93. Among the four land portions 33 that do not overlap the electronic device D, the land portions 33 that do not neighbor the overlapped land portions 91 and 92 are referred to as second non-overlapped land portions 94.

The first non-overlapped land portions 93 are disposed on either side of a set of the three overlapped land portions 91 and 92 in the Y direction. Each of the second non-overlapped land portions 94 is disposed opposite to the overlapped land portions 91 and 92 with respect to the first non-overlapped land portion 93. In FIG. 22, the second non-overlapped land portions 94 are disposed at the uppermost and lowermost positions, and the two first non-overlapped land portions 93 are disposed between these two second non-overlapped land portions 94. In addition, three overlapped land portions 91 and 92 are disposed between the two first non-overlapped land portions 93. In FIG. 22, among the three overlapped land portions 91 and 92, the lowermost overlapped land portion (the second overlapped land portion 92 described below) neighbors the lower first non-overlapped land portion 93 in the Y direction. Similarly, in FIG. 22, among the three overlapped land portions 91 and 92, the uppermost overlapped land portion (the second overlapped land portion 92 described below) neighbors the upper first non-overlapped land portion 93 in the Y direction.

A liquid storage portion 70 is provided in each of the overlapped land portions 91 and 92. The liquid storage portions 70 provided in the overlapped land portions 91 and 92 are located in the region that overlaps the electronic device D in plan view. These liquid storage portions 70 may extend to the outside of the electronic device D in the X direction. The liquid storage portions 70 provided in the overlapped land portions 91 and 92 extend to the outside of both the sides of the electronic device D in the X direction. In the example illustrated in FIG. 22, the liquid storage portions 70 provided in the overlapped land portions 91 and 92 extend to the outside of the left side and the right side of the electronic device D.

The three overlapped land portions 91 and 92 include one first overlapped land portion 91 and two second overlapped land portions 92. The second overlapped land portions 92 are disposed on either side in the Y direction of the first overlapped land portion 91. Each of the second overlapped land portions 92 neighbors the first overlapped land portion 91 in the Y direction. The liquid storage portion 70 provided in the first overlapped land portion 91 neighbors the liquid storage portions 70 provided in the second overlapped land portions 92 in the Y direction. In plan view, the liquid storage portion 70 provided in the first overlapped land portion 91 is located closer to the center of the electronic device D in the Y direction than the liquid storage portions 70 provided in the second overlapped land portions 92. That is, the liquid storage portions 70 provided in the second overlapped land portions 92 are farther away from the center of the electronic device D than the liquid storage portion 70 provided in the first overlapped land portion 91. In FIG. 22, the liquid storage portion 70 provided in the first overlapped land portion 91 overlaps the center of the electronic device D. A length L1 in the X direction of the liquid storage portion 70 provided in the first overlapped land portion 91 is greater than a length L2 in the X direction of the liquid storage portion 70 provided in the second overlapped land portions 92. The liquid storage portion 70 provided in the first overlapped land portion 91 has a larger amount of extension to the outside of the electronic device D than the liquid storage portion 70 provided in the second overlapped land portions 92. The lengths L1 and L2 may be the lengths in the X direction of the liquid storage mainstream groove 71 of the liquid storage portion 70. If the liquid storage portion 70 includes a plurality of liquid storage mainstream grooves 71, the length may be the longest length of the liquid storage mainstream grooves 71.

The liquid storage portion 70 is provided in each of the first non-overlapped land portions 93. The liquid storage portions 70 provided in the first non-overlapped land portions 93 are disposed in a region different from a region that overlaps the electronic device D in plan view. That is, the liquid storage portions 70 do not overlap the electronic device D. The liquid storage portion 70 provided in the second overlapped land portion 92 neighbors the liquid storage portion 70 provided in the first non-overlapped land portion 93 in the Y direction. The length L2 in the X direction of the liquid storage portion 70 provided in the second overlapped land portion 92 is greater than a length L3 in the X direction of the liquid storage portion 70 provided in the first non-overlapped land portion 93. Note that FIG. 22 illustrates an example in which the length L3 is the same as the length of the electronic device D. However, the length is not limited thereto, and the liquid storage portion 70 may extend to the outside of the electronic device D in the X direction. Alternatively, the length of the liquid storage portion 70 in the X direction may be less than the length of the electronic device D in the X direction. Like the lengths L1 and L2, the length L3 may be the length in the X direction of the liquid storage mainstream groove 71 of the liquid storage portion 70.

As illustrated in FIG. 22, the liquid storage portion 70 need not be provided in the second non-overlapped land portion 94. However, the configuration is not limited thereto, and the liquid storage portion 70 may be provided in the second non-overlapped land portion 94.

As described above, according to the fifth modification, the liquid storage portion 70 is disposed in a region of the vapor chamber 1 that overlaps the electronic device D in plan view. This allows the liquid storage portion 70 to be disposed in a region where heat is easily received from the electronic device D. Accordingly, while the electronic device D is generating heat, the working liquid 2b in the liquid storage portion 70 can evaporate upon receiving the heat from the electronic device D. As a result, the heat of the electronic device D can be dispersed more and, thus, the efficiency for cooling the electronic device D can be increased.

In addition, according to the fifth modification, the liquid storage portion 70 extends to the outside of the electronic device D in the X direction. This allows the working liquid 2b in the liquid storage portion 70 to evaporate using the heat transferred from the electronic device D in the vicinity of the region that overlaps the electronic device D. More specifically, in the region that neighbors the region that overlaps the electronic device D in the X direction, the working liquid 2b in the liquid storage portion 70 can evaporate using the heat of the electronic device D. As a result, the amount of evaporation of the working liquid 2b can be increased. As a result, the heat of the electronic device D can be dispersed more and, thus, the efficiency for cooling the electronic device D can be increased more.

In addition, according to the fifth modification, the liquid storage portion 70 provided in the first overlapped land portion 91 is located closer to the center of the electronic device D in the Y direction in plan view than the liquid storage portion 70 provided in the second overlapped land portion 92. The length L1 in the X direction of the liquid storage portion 70 provided in the first overlapped land portion 91 is greater than the length L2 in the X direction of the liquid storage portion 70 provided in the second overlapped land portion 92. Accordingly, the length in the X direction of the liquid storage portion 70 located closer to the center of the electronic device D can be increased. As a result, the volume of the working liquid 2b loaded into the liquid storage mainstream groove 71 that overlaps the vicinity of the center of the electronic device D can be increased. As a result, the amount of evaporation of the working liquid 2b in the vicinity of the center of the electronic device D can be increased, and the region in the vicinity of the center of the electronic device D can be efficiently cooled.

In addition, according to the fifth modification, a liquid storage portion 70 is provided in each of the second overlapped land portions 92 constituting a pair and the first non-overlapped land portions 93 that neighbor each other. The liquid storage portion 70 provided in the second overlapped land portion 92 is disposed in a region that overlaps the electronic device D, and the liquid storage portion 70 provided in the first non-overlapped land portion 93 is disposed in a region different from the region that overlaps the electronic device D. This allows the working liquid 2b in the liquid storage portion 70 to evaporate using the heat transferred from the electronic device D in the vicinity of the region that overlaps the electronic device D. More specifically, in the region that neighbors the region that overlaps the electronic device D in the Y direction, the working liquid 2b in the liquid storage portion 70 can evaporate using the heat of the electronic device D. Accordingly, the amount of evaporation of the working liquid 2b can be increased. As a result, the heat of the electronic device D can be dispersed more, and the efficiency for cooling the electronic device D can be increased more.

In addition, according to the fifth modification, the length L2 in the X direction of the liquid storage portion 70 provided in the second overlapped land portion 92 is greater than the length L3 in the X direction of the liquid storage portion 70 provided in the first non-overlapped land portion 93. This configuration can increase the length in the X direction of the liquid storage portion 70 that overlaps the electronic device D. As a result, the volume of the working liquid 2b loaded into the liquid storage mainstream groove 71 that overlaps the electronic device D can be increased. As a result, the amount of evaporation of the working liquid 2b in the region that overlaps the electronic device D can be increased, and the electronic device D can be cooled efficiently.

The fifth modification has been described above with reference to an example in which the entire liquid storage portion 70 provided in the second overlapped land portion 92 overlaps the electronic device D in the Y direction. However, the configuration is not limited thereto. The liquid storage portion 70 provided in the second overlapped land portion 92 may overlap the electronic device D in part of the range in the Y direction (refer to FIG. 23). In this case, the liquid storage portion 70 does not overlap the electronic device D in the remaining part of the range in the Y direction. In FIG. 22, an example is illustrated in which the electronic device D extends to the outside of the liquid storage portion 70 provided in the second overlapped land portion 92 in the Y direction. However, the configuration is not limited thereto, and the electronic device D may be aligned with the edge of the second overlapped land portion 92. In this case, the edge of the electronic device D overlaps the edge of the wall surface 54a of the upper vapor flow channel recess 54 on the second body surface 31b.

In addition, the fifth modification has been described above with reference to an example in which the electronic device D overlaps the liquid storage portions 70 provided in the three overlapped land portions 91 and 92. However, the configuration is not limited thereto, and the number of overlapped land portions 91 and 92 in which the liquid storage portions 70 where the electronic device D overlaps are provided is any number. In addition, the example has been described in which each of the non-overlapped land portions 93 and 94 is provided on both sides in the Y direction of the set of the three overlapped land portions 91 and 92. However, the configuration is not limited thereto, and the number of each of the non-overlapped land portions 93 and 94 provided on both sides in the Y direction of the set of the three overlapped land portions 91 and 92 may be one or three or more.

(Sixth Modification)

Figure 23:
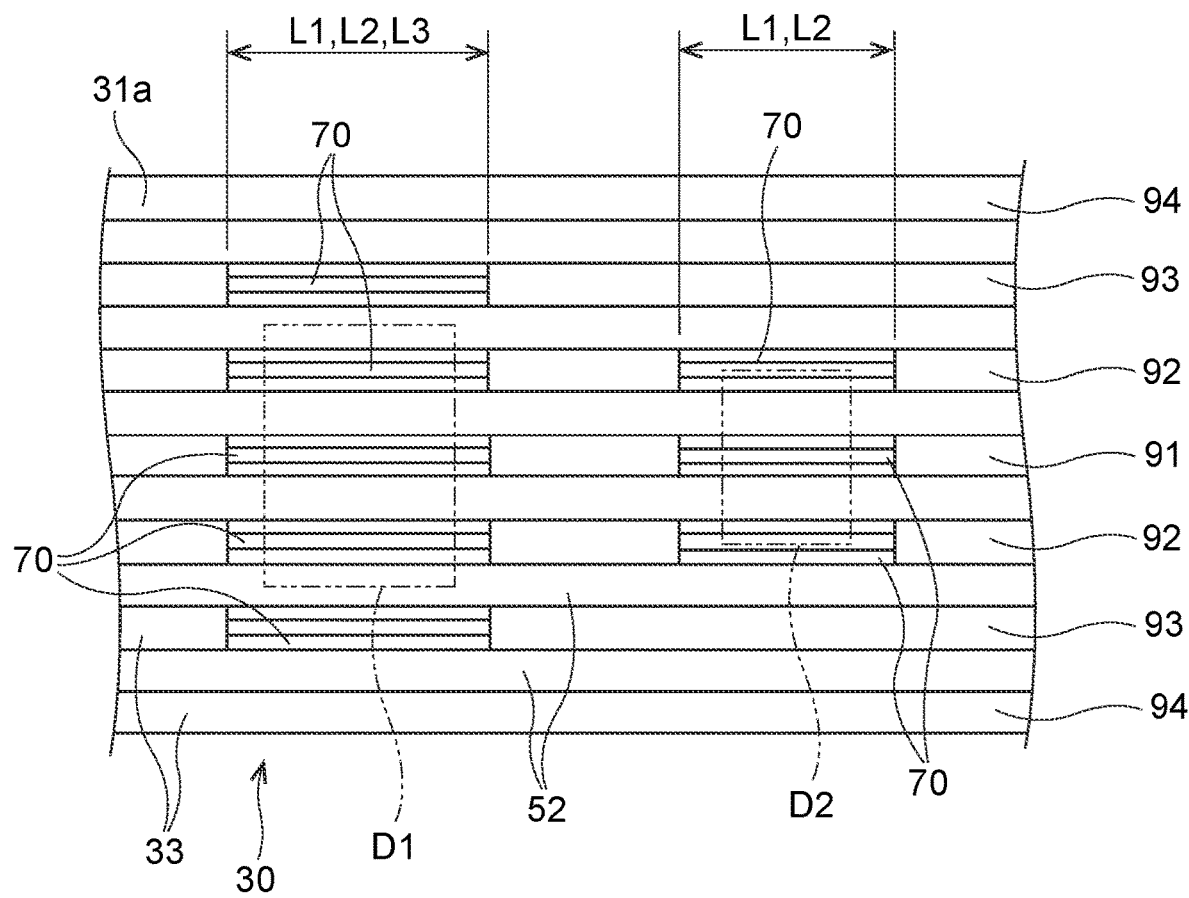
FIG. 23 is a bottom view of the wick sheet illustrated in FIG. 3 according to a sixth modification.

In addition, as illustrated in FIG. 23, the vapor chamber 1 may be in thermal contact with a plurality of electronic devices D.

More specifically, as illustrated in FIG. 23, a plurality of electronic devices D are attached to the second body surface 31b. In FIG. 23, an example in which two electronic devices D1 and D2 are attached to the second body surface 31b is illustrated. However, the number of electronic devices D may be three or more. The two electronic devices D are disposed in different regions in the X direction. The electronic device D on the left in FIG. 23 is referred to as the first electronic device D1, and the electronic device D on the right is referred to as the second electronic device D2.

A plurality of liquid storage portions 70 each corresponding to the electronic devices D1 or D2 may be provided on the first body surface 31a. In this case, the liquid storage portions 70 may be disposed in regions that overlap the corresponding electronic devices D1 and D2 in plan view.

One or more of the land portions 33 is provided with a liquid storage portion 70. As in the example illustrated in FIG. 22, each of the electronic devices D1 and D2 overlaps the plurality of land portions 33. As in the example illustrated in FIG. 22, the plurality of land portions 33 include three overlapped land portions 91 and 92, two first non-overlapped land portions 93, and two second non-overlapped land portions 94. Each of the three overlapped land portions 91 and 92 is provided with the liquid storage portion 70 that overlaps the first electronic device D1 and the liquid storage portion 70 that overlaps the second electronic device D2. As in the example illustrated in FIG. 22, the first non-overlapped land portion 93 is provided with the liquid storage portion 70 that overlaps the first electronic device D1. However, the first non-overlapped land portion 93 is not provided with the liquid storage portion 70 that overlaps the second electronic device D2. The second non-overlapped land portions 94 is not provided with the liquid storage portion 70.

The dimensions in the X direction of the two electronic devices D1 and D2 may differ from each other. In this case, the lengths in the X direction of the two liquid storage portions 70 may differ from each other. Note that in FIG. 23, an example is illustrated in which the lengths in the X direction of the liquid storage portions 70 are the same in each of the electronic devices D. The liquid storage portions 70 that overlap the first electronic device D1 are described in more detail below. The lengths L1 and L2 in the X direction of the liquid storage portions 70 provided in the overlapped land portions 91 and 92 are the same. In addition, the lengths L1 and L2 and the length L3 in the X direction of the liquid storage portion 70 provided in the first non-overlapped land portion 93 are the same. However, the lengths are not limited thereto. The lengths L1, L2, and L3 in the X direction of the liquid storage portions 70 may differ among land portions, as illustrated in FIG. 22. The same applies to the liquid storage portions 70 that overlap the second electronic device D2.

As described above, according to the sixth modification, the vapor chamber 1 is in thermal contact with a plurality of electronic devices D1 and D2, and a plurality of liquid storage portions 70 each corresponding to one of the electronic devices D1 and D2 are provided on the first body surface 31a. Each of the liquid storage portions 70 is disposed in a region of the vapor chamber 1 that overlaps the corresponding one of the electronic devices D1 and D2 in plan view. Thus, each of the liquid storage portions 70 can be disposed in a region where heat is easily received from the corresponding one of the electronic devices D1 and D2. Accordingly, while each of the electronic devices D1 and D2 is generating heat, the working liquid 2b in each of the liquid storage portions 70 can evaporate by receiving heat from a corresponding one of the electronic device D1 and D2. As a result, the heat of each of the electronic devices D1 and D2 can be dissipated more, and the efficiency for cooling each of the electronic devices D1 and D2 can be increased more.

In addition, according to the sixth modification, at least one of the plurality of land portions 33 is provided with a plurality of liquid storage portions 70 that overlap the corresponding one of the electronic devices D1 and D2. In this manner, the liquid storage portion 70 can be provided in the land portion 33 in a region that overlaps the corresponding one of the electronic devices D1 and D2. As a result, each of the liquid storage portions 70 can be disposed in a region where heat is easily received from the corresponding one of the electronic devices D1 and D2.

Note that in the sixth modification, the two electronic devices D1 and D2 do not have to be generating heat at the same time. For example, when the first electronic device D1 is generating heat and the second electronic device D2 has stopped generating heat, the working liquid 2b in the liquid storage portion 70 that overlaps the first electronic device D1 can evaporate due to the heat received from the first electronic device D1. The working liquid 2b in the liquid storage portion 70 that overlaps the second electronic device D2 can be continuously stored.

The sixth modification has been described above with reference to an example in which two liquid storage portions 70 are provided in each of the three overlapped land portions 91 and 92. However, the configuration is not limited thereto, and the number of overlapped land portions 91 and 92 each having two liquid storage portions 70 provided therein is not limited to three, but can be any number. For example, the number of such overlapped land portions 91 and 92 may be one. For example, two liquid storage portions 70 may be provided in the first overlapped land portion 91, and one liquid storage portion 70 may be provided in the second overlapped land portion 92. In this case, a liquid storage portion 70 that overlaps the first electronic device D1 and a liquid storage portion 70 that overlaps the second electronic device D2 may be provided in the first overlapped land portion 91. One second overlapped land portion 92 may be provided with a liquid storage portion 70 that overlaps the first electronic device D1 without being provided with a liquid storage portion 70 that overlaps the second electronic device D2. The other second overlapped land portion 92 may be provided with a liquid storage portion 70 that overlaps the second electronic device D2 without being provided with a liquid storage portion 70 that overlaps the first electronic device D1. That is, at least one of the liquid storage portion 70 that overlaps the first electronic device D1 and the liquid storage portion 70 that overlaps the second electronic device D2 may be provided in each of the overlapped land portions 91 and 92.

In addition, the sixth modification has been described above with reference to an example in which a plurality of liquid storage portions 70 are provided on the first body surface 31a so as to overlap a corresponding one of the electronic device D1 and D2 in plan view. However, the configuration is not limited thereto. For example, if the first body surface 31a is provided with a liquid storage portion 70 that overlaps one of the two electronic devices D1 and D2, a liquid storage portion 70 that overlaps the other need not be provided. The same applies to the case in which the number of electronic devices D is three or greater. That is, a plurality of liquid storage portions 70 may be provided on the first body surface 31a so as to overlap all of the electronic devices D. However, the first body surface 31a may be provided with liquid storage portions 70 that overlap one or more of the electronic devices D without being provided with the liquid storage portions 70 that overlap other of the electronic devices D.

Second Embodiment

A wick sheet for a vapor chamber, a vapor chamber, and an electronic apparatus according to the second embodiment of the present invention are described below with reference to FIGS. 24 to 27.

According to the second embodiment illustrated in FIGS. 24 to 27, the main difference is that a liquid storage portion is disposed in a region different from an evaporation region in plan view, and the other configurations are substantially the same as those of the first embodiment illustrated in FIGS. 1 to 23. Note that in FIGS. 24 to 27, parts similar to those of the first embodiment illustrated in FIGS. 1 to 23 are identified by the same reference numerals, and detailed description of the parts is not repeated.

Figure 24:
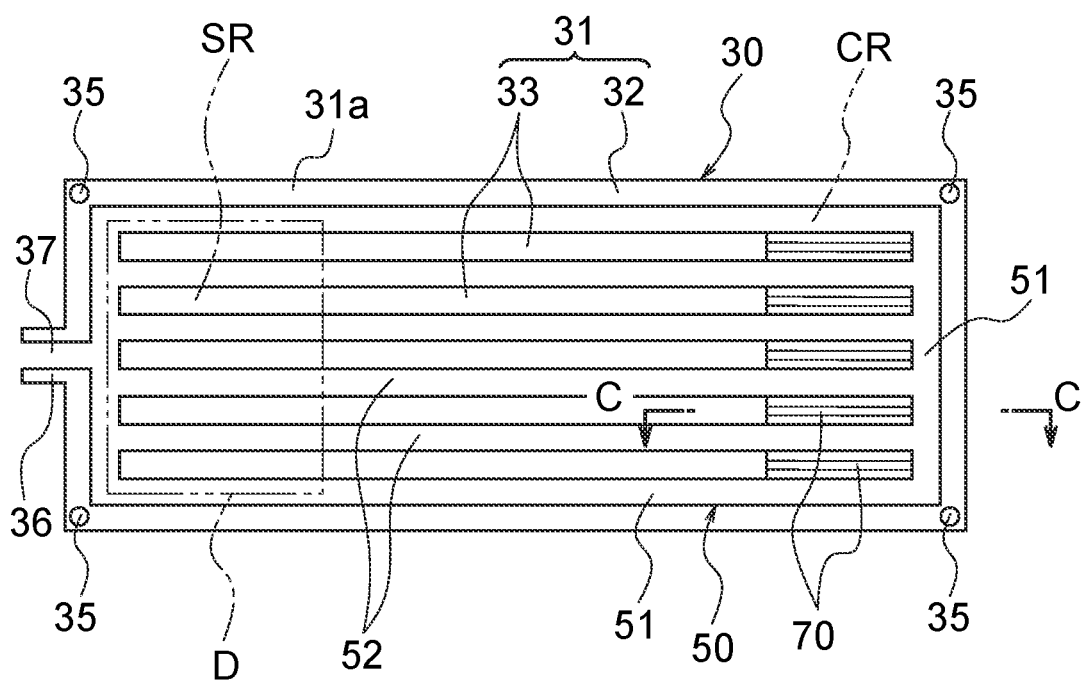
FIG. 24 is a bottom view of a wick sheet of a vapor chamber according to a second embodiment of the present invention.
Figure 25:
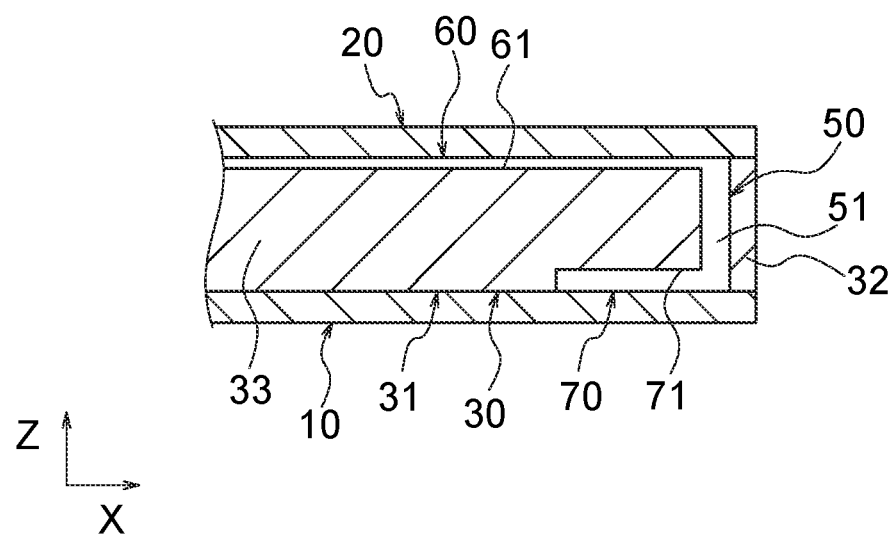
FIG. 25 is a partial sectional view taken along line C-C of FIG. 24.

In the present embodiment, as illustrated in FIG. 24, the liquid storage portion 70 according to the present embodiment may be disposed on one side of the land portion 33 in the X direction. The liquid storage portion 70 may be formed on the one side of the center of the land portion 33 in the X direction. The liquid storage portion 70 may be disposed on the opposite side from an evaporation region SR. As illustrated in FIG. 24, the liquid storage portion 70 may be disposed on the right side of the land portion 33. The liquid storage portion 70 is disposed in a region different from the evaporation region SR in plan view. The liquid storage portion 70 is disposed in a condensation region CR. In this case, the liquid storage portion 70 is disposed in a region different from a region that overlaps an electronic device D. More specifically, as illustrated in FIGS. 24 and 25, the liquid storage portion 70 is disposed in a portion opposite to the evaporation region SR of the land portion 33 in the X direction. The liquid storage mainstream grooves 71 of the liquid storage portion 70 are formed so as to continuously extend from an opposite edge from the evaporation area SR of the land portion 33 toward an edge closer to the evaporation area SR in the X direction up to a predetermined position. In FIG. 24, the liquid storage portion 70 is formed from the right edge toward the left edge up to a predetermined position. In this way, the range of the liquid storage portion 70 in the X direction is defined. Since the other configurations of the liquid storage portion 70 are similar to those of the liquid storage portion 70 according to the first embodiment, a detailed description of the configurations is not repeated.

As described above, in a typical vapor chamber 1, the working fluids 2a and 2b reflux in the sealed space 3 while repeating the phase change, that is, evaporation and condensation. Thus, the working fluids 2a and 2b transfer and dissipate the heat from the electronic device D. The reflux of the working fluids 2a and 2b can be formed in the entire range of the vapor chamber 1. This allows the working vapor 2a to dissipate the heat in the entire range of the vapor chamber 1. That is, the region that dissipates the heat can be increased. As a result, the heat dissipation efficiency of the vapor chamber 1 can be increased, and the electronic device D can be cooled efficiently. In this case, the temperature difference in the vapor chamber 1 can be reduced, and the temperature can be equalized.

Figure 26:
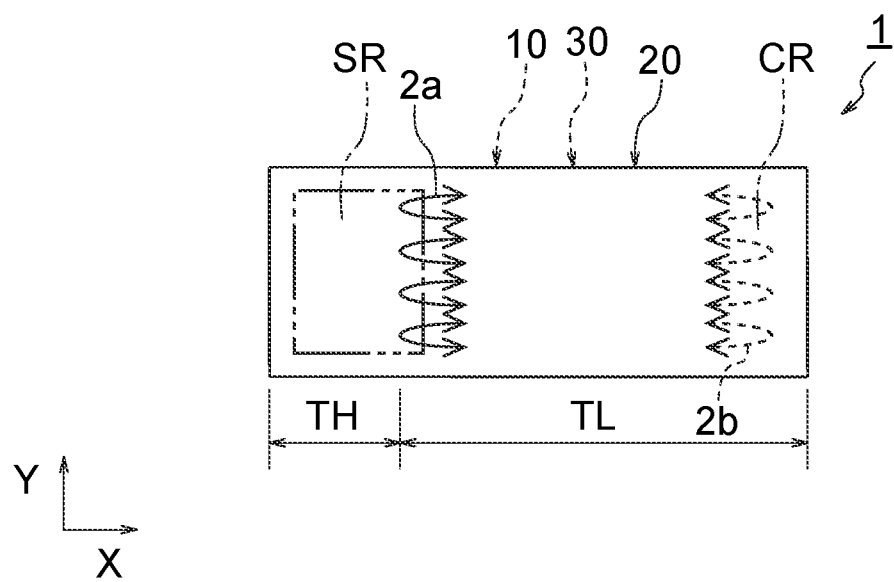
FIG. 26 is a schematic illustration describing the reflux of a working fluid in a known vapor chamber when the amount of heat generated by an electronic device is large.

However, if the amount of heat generated by the electronic device D is large, the working liquid 2b condensed in the condensation region CR is difficult to be delivered to the center of the evaporation region SR, as illustrated in FIG. 26. That is, due to the large amount of heat generated by the electronic device D, the working liquid 2b tends to evaporate before it reaches the center of the evaporation region SR. Therefore, the reflux of the working fluids 2a and 2b is formed in a region other than a region around the center of the evaporation region SR and, thus, the temperature at the center of the evaporation region SR may rise. Accordingly, the efficiency for cooling the electronic device D may be decreased. As a result, a region TH having a high temperature and a region TL having a low temperature appear in the vapor chamber 1, and the temperature difference may increase.

Figure 27:
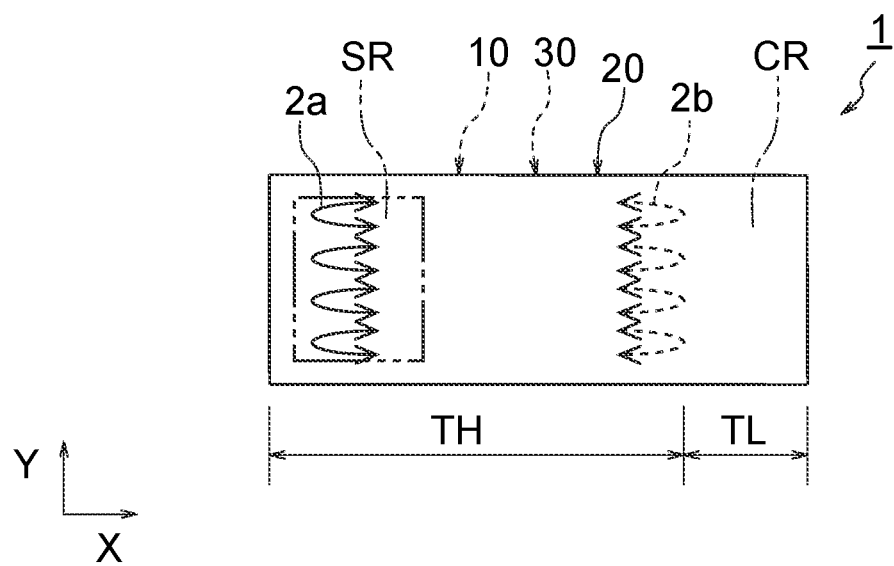
FIG. 27 is a schematic illustration describing the reflux of working fluid in a known vapor chamber when the amount of heat generated by an electronic device is small.

In contrast, if the amount of heat generated by the electronic device D is small, part of the working liquid 2b condensed in the condensation region CR tends to remain in the liquid flow channel portion 60 in the evaporation region SR, as illustrated in FIG. 27. That is, since the amount of heat generated by the electronic device D is small, the amount of evaporation of the working liquid 2b in the evaporation region SR decreases. Accordingly, the amount of working liquid 2b delivered to the evaporation region SR decreases, and the working liquid 2b tends to remain in the liquid flow channel portion 60 in the condensation region CR. As a result, the reflux of the working fluids 2a and 2b is formed within the range excluding the vicinity of the edge closer to the evaporation region SR (the vicinity of the right edge in FIG. 27), and the working liquid 2b in the vicinity of the edge may remain in the liquid flow channel portion 60. As a result, the region where the working vapor 2a dissipates heat decreases, and the heat dissipation efficiency of the vapor chamber 1 may be decreased. As a result, the region TH having a high temperature and the region TL having a low temperature appear in the vapor chamber 1 and, thus, the temperature difference may increase.

However, in the vapor chamber 1 according to the present embodiment, while the electronic device D is generating heat, part of the working liquid 2b condensed in the condensation region CR is delivered not to the evaporation region SR, but to the liquid storage portion 70 provided on the first body surface 31a of the wick sheet 30. Thereafter, the working liquid 2b is stored in the liquid storage portion 70. Since the liquid storage portion 70 according to the present embodiment is disposed in the condensation region CR, the working liquid 2b in the liquid storage portion 70 does not evaporate easily and is stored in the liquid storage portion 70.

When the amount of heat generated by the electronic device D is large, the working liquid 2b condensed in the condensation region CR can be delivered to the center of the evaporation region SR. That is, even when the amount of heat generated by the electronic device D is large, not only the working liquid 2b in the liquid flow channel portion 60 but also the working liquid 2b stored in the liquid storage portion 70 can be delivered toward the center of the evaporation region SR, thus increasing the amount of working liquid 2b to be delivered to the evaporation region SR. This enables the working liquid 2b to reach even the center of the evaporation region SR, and the reflux of the working fluids 2a and 2b can be formed in the entire range of the vapor chamber 1. Thus, the temperature at the center of the evaporation region SR can be decreased, and the efficiency for cooling the electronic device D can be increased. As a result, the temperature difference in the vapor chamber 1 can be decreased, and the temperature can be equalized.

In contrast, when the amount of heat generated by the electronic device D is small, part of the working liquid 2b condensed in the condensation region CR can be stored in the liquid storage portion 70, and the working liquid 2b can be inhibited from remaining in the liquid flow channel portion 60 in the evaporation region SR. This allows the reflux of the working fluids 2a and 2b to be formed in the entire range of the vapor chamber 1. Accordingly, the region where the working vapor 2a dissipates heat can be increased, thus increasing the heat dissipation efficiency of the vapor chamber 1. As a result, the temperature difference in the vapor chamber 1 can be decreased.

As described above, according to the present embodiment, the liquid flow channel portion 60 through which the working liquid 2b flows is provided on the second body surface 31b of the sheet body 31 of the wick sheet 30, and the liquid storage portion 70 is provided on the first body surface 31a positioned on the opposite side from the second body surface 31b. The liquid storage portion 70 is disposed in a region different from the evaporation region SR in plan view. This allows the working liquid 2b to be distributed and stored in the liquid storage portion 70 in addition to the liquid flow channel portion 60. When the amount of heat generated by the electronic device D is large, the working liquid 2b stored in the liquid storage portion 70 can be delivered to the evaporation region SR, thus increasing the range in which the reflux of the working fluids 2a and 2b is formed. In this manner, the efficiency for cooling the electronic device D can be increased. When the amount of heat generated by the electronic device D is small, the working liquid 2b can be inhibited from remaining in the liquid flow channel portion 60 in the evaporation region SR, and the range in which the reflux of the working fluids 2a and 2b is formed can be increased. Thus, the region where the working vapor 2a dissipates heat can be increased, and the heat dissipation efficiency of the vapor chamber 1 can be increased. As a result, a decrease in the performance of the vapor chamber 1 can be reduced regardless of the amount of heat generated by the electronic device D.

In addition, according to the present embodiment, the working liquid 2b can be stored in the liquid storage portion 70, as described above. This allows the working liquid 2b to be distributed and stored in not only the liquid flow channel portion 60 but the liquid storage portion 70 while the electronic device D stops generating heat. Therefore, even if the working liquid 2b in the liquid flow channel portion 60 freezes and expands in a temperature environment lower than the freezing point of the working liquid 2b, the force of expansion exerted on the upper sheet 20 can be decreased, and deformation of the upper sheet 20 can be inhibited. In addition, even if the working liquid 2b in the liquid storage portion 70 freezes and expands, the force of expansion exerted on the lower sheet 10 can be decreased and, thus, deformation of the lower sheet 10 can be inhibited. As a result, deformation of the vapor chamber 1 can be inhibited.

In addition, according to the present embodiment, the plurality of convex portions 74 protruding from the sheet body 31 of the wick sheet 30 and being in contact with the lower sheet 10 are provided in the liquid storage portion 70. The gap between a pair of the convex portions 74 (corresponding to the width w6 of the liquid storage mainstream groove 71) neighboring each other is greater than the width w3 of the liquid flow channel mainstream groove 61 of the liquid flow channel portion 60. This allows the capillary force that acts on the working liquid 2b in the liquid storage portion 70 to be smaller than the capillary force that acts on the working liquid 2b in the liquid flow channel portion 60 (in the liquid flow channel mainstream groove 61). While the electronic device D is generating heat, the amount of movement of the working liquid 2b delivered to the liquid storage portion 70 can be reduced. Accordingly, a decrease in the function of delivering the working liquid 2b to the evaporation region SR can be reduced, and a decrease in heat transport efficiency can be reduced. In addition, as described above, by making the gap between the convex portions 74 greater than the width w3 of the liquid flow channel mainstream groove 61, the total volume of a space formed by the liquid storage mainstream grooves 71 and a space formed by the liquid storage communication grooves 75 of the liquid storage portion 70 can be increased. As a result, the volume of the working liquid 2b stored by the liquid storage portion 70 can be increased. In addition, when the amount of heat generated by the electronic device D is small, the working liquid 2b can be further inhibited from remaining in the liquid flow channel portion 60 in the condensation region CR.

In addition, according to the present embodiment, the liquid storage portion 70 has the liquid storage mainstream grooves 71 each provided between two neighboring convex portions 74 in the Y direction that is orthogonal to the X direction in which the liquid flow channel mainstream grooves 61 of the liquid flow channel portion 60 extend. The liquid storage mainstream grooves 71 extend in the X direction. This enables the working liquid 2b in the liquid storage portion 70 to flow in the X direction, and the working liquid 2b flowing out of the liquid storage portion 70 can have a propulsive force in the X direction. Thus, the working liquid 2b flowing out of the liquid storage portion 70 can be smoothly delivered to the evaporation region SR.

In addition, according to the present embodiment, the gap between a pair of the convex portions 74 neighboring each other is less than the gap between the pair of the land portions 33 (corresponding to the width w2 of the penetration portion 34) neighboring each other. This enables the capillary force to act on the working liquid 2b in the liquid storage portion 70. As a result, the working liquid 2b can be drawn into the liquid storage portion 70, and the working liquid 2b can be stored in the liquid storage portion 70.

In addition, according to the present embodiment, the liquid storage portions 70 are provided on the first body surface 31a of each of the land portions 33. This enables the working liquid 2b to be distributed and stored in the liquid storage portions 70. Accordingly, if the amount of heat generated by the electronic device D is large, the amount of the working liquid 2b delivered to the evaporation region SR can be increased, and the efficiency for cooling the electronic device D can be increased more. If the amount of heat generated by the electronic device D is small, the working liquid 2b can be inhibited from remaining in the liquid flow channel portion 60 more, and the heat dissipation efficiency of the vapor chamber 1 can be increased more.

In addition, according to the present embodiment, the liquid storage portion 70 is disposed on one side of the land portion 33 in the X direction. This enables the liquid storage portion 70 to be disposed in a region different from the evaporation region SR when the evaporation region SR is formed on one side of the vapor chamber 1 in the X direction. Accordingly, if the amount of heat generated by the electronic device D is large, the amount of the working liquid 2b delivered to the evaporation region SR can be increased, and the efficiency for cooling the electronic device D can be increased more. If the amount of heat generated by the electronic device D is small, the working liquid 2b can be inhibited from remaining in the liquid flow channel portion 60 more, and the heat dissipation efficiency of the vapor chamber 1 can be increased more.

Note that the first, second, third and fourth modifications, which are described as modifications of the first embodiment, are applicable to the present embodiment described above in the same way as in the first embodiment.

For example, according to the second embodiment, by providing a communication portion 80 as in the first modification, the working liquid 2b can move smoothly between the liquid flow channel portion 60 and the liquid storage portion 70. This configuration can increase the amount of movement of the working liquid 2b delivered from the liquid flow channel portion 60 to the liquid storage portion 70, resulting in an increase in the amount of working liquid 2b stored in the liquid storage portion 70. In addition, if the amount of heat generated by the electronic device D is large, the working liquid 2b stored in the liquid storage portion 70 can be smoothly delivered to the evaporation region SR. The range in which the reflux of the working fluids 2a and 2b is formed can be effectively increased. As a result, the efficiency for cooling the electronic device D can be increased more. If the amount of heat generated by the electronic device D is small, the working liquid 2b can be inhibited from remaining in the liquid flow channel portion 60 in the evaporation region SR more, and the range in which the reflux of the working fluids 2a and 2b is formed can be increased. As a result, the heat dissipation efficiency of the vapor chamber 1 can be increased more.

In addition, as in the first modification, the flow resistance of the working liquid 2b between the liquid flow channel portion 60 and the liquid storage portion 70 can be reduced by the communication portion 80 including a communication recess 81. This configuration can increase the efficiency for cooling the electronic device D more if the amount of heat generated by the electronic device D is large. If the amount of heat generated by the electronic device D is small, the heat dissipation efficiency of the vapor chamber 1 can be increased more. Furthermore, according to the first modification, the communication recess 81 extends to the liquid flow channel communication groove 65 and the liquid storage communication groove 75 and, thus, the flow resistance of the working liquid 2b between the liquid flow channel portion 60 and the liquid storage portion 70 can be reduced more.

For example, according to the second embodiment, the flow resistance of the working liquid 2b between the liquid flow channel portion 60 and the liquid storage portion 70 can be reduced by the communication portion 80 including a through-hole 82, as in the second modification. This configuration can increase the efficiency for cooling the electronic device D more if the amount of heat generated by the electronic device D is large. In contrast, this configuration can further increase the heat dissipation efficiency of the vapor chamber 1 more if the amount of heat generated by the electronic device D is small. Furthermore, according to the second modification, the through-hole 82 extends to the liquid flow channel intersection portion 66 and the liquid storage intersection portion 76, resulting in a further decrease in the flow resistance of the working liquid 2b between the liquid flow channel portion 60 and the liquid storage portion 70.

The liquid storage portion 70 according to the present embodiment described above may be combined with the liquid storage portion 70 according to the first embodiment. In this case, two liquid storage portions 70 are provided in each of the land portions 33 of the wick sheet 30. One liquid storage portion 70 is disposed in the evaporation region SR in plan view, and the other is disposed in the condensation region CR in plan view. The liquid storage portion 70 in the evaporation region SR and the liquid storage portion 70 in the condensation region CR may be spaced apart from each other in the X direction. In this case, both the effect obtained by the liquid storage portion 70 of the first embodiment and the effect obtained by the liquid storage portion 70 of the second embodiment can be obtained.

The present invention is not limited to the above-described embodiments and modifications without any change, but can be embodied by changing the shapes of the components in the implementation stage without departing from the spirit and scope of the invention. In addition, various inventions can be discerned by appropriately combining the multiple components described in the above embodiments and modifications. Some components may be removed from all of the components described in the embodiments and the modifications.

The invention claimed is:

1. A wick sheet for a vapor chamber, in which a working fluid is enclosed, the wick sheet comprising:
a sheet body having a first body surface and a second body surface provided on an opposite side from the first body surface;
a penetration space that penetrates the sheet body;
a first groove assembly provided on the second body surface, the first groove assembly communicating with the penetration space; and
a second groove assembly provided on the first body surface, the second groove assembly communicating with the penetration space, wherein
the first groove assembly includes:
a plurality of first mainstream grooves that extend in a first direction, and
a plurality of convex portions arranged between neighboring first mainstream grooves,
the second groove assembly includes:
a plurality of second mainstream grooves that extend in the first direction, and a plurality of convex portions arranged between neighboring second mainstream grooves,
a flow channel cross-sectional area of a second mainstream groove of the plurality of second mainstream grooves is greater than a flow channel cross-sectional area of a first mainstream groove of the plurality of first mainstream grooves, and
a total area of the second groove assembly on the first body surface is smaller than a total area of the first groove assembly on the second body surface in a plan view of the wick sheet.

2. The wick sheet according to claim 1, wherein a width of the second mainstream groove is greater than a width of the first mainstream groove.

3. The wick sheet according to claim 1, wherein a depth of the second mainstream groove is greater than a depth of the first mainstream groove.

4. The wick sheet according to claim 1,
wherein the sheet body includes a plurality of land portions that partition the penetration space into a plurality of passages,
the land portions are spaced apart from each other in a second direction that is orthogonal to the first direction, and
a width of the second mainstream groove is less than a gap between a pair of the land portions neighboring each other.

5. The wick sheet according to claim 1,
wherein the sheet body includes a plurality of land portions that partition the penetration space into a plurality of passages,
the first groove assembly and the second groove assembly are provided in at least one of the land portions, and
a number of the second mainstream grooves provided in the land portion is less than a number of the first mainstream grooves provided in the land portion.

6. The wick sheet according to claim 1, wherein
the sheet body includes a plurality of land portions that extend in the first direction and that partition the penetration space into a plurality of passages, and
the second groove assembly is disposed on one side of the land portions in the first direction.

7. The wick sheet according to claim 1,
wherein the sheet body includes a plurality of land portions that partition the penetration space into a plurality of passages,
the second groove assembly is provided in at least a pair of the land portions that neighbor each other in a second direction that is orthogonal to the first direction, and
a length in the first direction of a second mainstream groove of the second groove assembly provided in one of the land portions is greater than a length in the first direction of a second mainstream groove of the second groove assembly provided in the other of the land portions.

8. The wick sheet according to claim 1, wherein the sheet body includes a plurality of land portions that partition the penetration space into a plurality of passages, and the second groove assembly includes portions that are spaced apart from each other and are provided in at least one of the land portions.

9. The wick sheet according to claim 1, further comprising:
a communication portion provided in the sheet body, the communication portion including a flow passage extending between and communicating with the first groove assembly and the second groove assembly.

10. The wick sheet according to claim 9, wherein the communication portion includes a communication recess as the flow passage, and the communication recess is provided on a wall surface of the penetration space and extends from the first groove assembly to the second groove assembly.

11. The wick sheet according to claim 10, wherein
the first groove assembly includes a first communication groove that extends in a direction different from the first direction and that communicates with the first mainstream groove,
the second groove assembly includes a second communication groove that extends in a direction different from the first direction and that communicates with the second mainstream groove, and
the communication recess extends to at least one of the first communication groove and the second communication groove.

12. The wick sheet according to claim 9, wherein the communication portion includes a through-hole as the flow passage, and the through-hole penetrates the sheet body and extends from the first groove assembly to the second groove assembly.

13. The wick sheet according to claim 12, wherein
the first groove assembly includes a first communication groove that extends in a direction different from the first direction and that communicates with the first mainstream groove,
the first mainstream groove includes a first intersection portion that communicates with the first communication groove,
the second groove assembly includes a second communication groove that extends in a direction different from the first direction and that communicates with the first communication groove,
the second mainstream groove includes a second intersection portion that communicates with the second communication groove, and
the through-hole extends to at least one of the first intersection portion and the second intersection portion.

14. The wick sheet according to claim 1, wherein:
the first groove assembly further includes a plurality of first communication grooves that extend in a direction different from the first direction and that communicate with one or more of the first mainstream grooves,
the plurality of convex portions of the first groove assembly is arranged between the neighboring first mainstream grooves and between neighboring first communication grooves,
the second groove assembly further includes a plurality of second communication grooves that extend in a direction different from the first direction and that communicate with one or more of the second mainstream grooves, and
the plurality of convex portions of the second groove assembly is arranged between the neighboring second mainstream grooves and between neighboring second communication grooves.

15. A vapor chamber comprising:
a first sheet;
a second sheet; and
the wick sheet fora vapor chamber according to claim 1, the wick sheet being sandwiched between the first sheet and the second sheet.

16. The vapor chamber according to claim 15, wherein the working fluid has freezing-expansion property.

17. An electronic apparatus comprising: a
housing;
an electronic device housed in the housing; and
the vapor chamber according to claim 15, the vapor chamber being in thermal contact with the electronic device.

18. The electronic apparatus according to claim 17, wherein the second groove assembly is disposed in a region that is different from a region that overlaps the electronic device in plan view of the vapor chamber.

19. An electronic apparatus comprising: a
housing;
an electronic device housed in the housing; and
the vapor chamber according to claim 16, the vapor chamber being in thermal contact with the electronic device.

20. The electronic apparatus according to claim 19, wherein the second groove assembly is disposed in a region that overlaps the electronic device in plan view of the vapor chamber.

21. The electronic apparatus according to claim 20, wherein the second groove assembly extends to an outside of the electronic device in the first direction.

22. The electronic apparatus according to claim 19, wherein the sheet body includes a first overlapped land portion and
a second overlapped land portion that partition the penetration space into a plurality of passages,
the first overlapped land portion and the second overlapped land portion are spaced apart from each other in a second direction that is orthogonal to the first direction,
the second groove assembly comprises a plurality of second groove assemblies, and one of the plurality of the second groove assemblies is provided in the first overlapped land portion and another of the plurality of the second groove assemblies is provided in the second overlapped land portion,
the second groove assembly provided in the first overlapped land portion and the second groove assembly provided in the second overlapped land portion are disposed in a region that overlaps the electronic device in plan view of the vapor chamber,
the second groove assembly provided in the first overlapped land portion is located closer to a center of the electronic device than the second groove assembly provided in the second overlapped land portion in the second direction that is orthogonal to the first direction in plan view of the vapor chamber, and
a length of the second groove assembly provided in the first overlapped land portion in the first direction is greater than a length of the second groove assembly provided in the second overlapped land portion in the first direction.

23. The electronic apparatus according to claim 18, wherein
the sheet body includes an overlapped land portion and a non-overlapped land portion that partition the penetration space into a plurality of passages,
the overlapped land portion and the non-overlapped land portion are spaced apart from each other and neighbor each other in a second direction that is orthogonal to the first direction,
the second groove assembly comprises a plurality of second groove assemblies, and one of the plurality of the second groove assemblies is provided in the overlapped land portion and another of the plurality of the second groove assemblies is provided in the non-overlapped land portion,
the second groove assembly provided in the overlapped land portion is disposed in a region chamber that overlaps the electronic device in plan view of the vapor, and
the second groove assembly provided in the non-overlapped land portion is disposed in a region that differs from the region that overlaps the electronic device in plan view of the vapor chamber.

24. The electronic apparatus according to claim 23, wherein a length of the second groove assembly provided in the overlapped land portion in the first direction is greater than a length of the second groove assembly provided in the non-overlapped land portion in the first direction.

25. A vapor chamber comprising: a
first sheet;
a second sheet; and
the wick sheet fora vapor chamber according to claim 8, the wick sheet being sandwiched by the first sheet and the second sheet, wherein
the working fluid has freezing-expansion property.

26. An electronic apparatus comprising: a
housing;
a plurality of electronic devices housed in the housing; and
the vapor chamber according to claim 25, the vapor chamber being in thermal contact with the electronic devices, wherein
the electronic devices are disposed in regions that are different from each other in the first direction,
a plurality of the second groove assemblies each corresponding to one of the electronic devices are provided on the first body surface, and
the second groove assembly is disposed in a region that overlaps the corresponding electronic devices in plan view of the vapor chamber.

27. A wick sheet for a vapor chamber, in which a working fluid is enclosed, the wick sheet comprising:
a sheet body having a first body surface and a second body surface provided on an opposite side from the first body surface;
a penetration space that penetrates the sheet body;
a first groove assembly provided on the second body surface, the first groove assembly communicating with the penetration space; and
a second groove assembly provided on the first body surface, the second groove assembly communicating with the penetration space, wherein
the first groove assembly includes a plurality of first mainstream grooves that extend in a first direction and a plurality of first communication grooves that extend in a direction different from the first direction and that communicate with one or more of the first mainstream grooves,
the first mainstream grooves each continuously extend from a first end to a second end along the first direction, and the first mainstream grooves are each intersected by the first communication grooves at a plurality of first intersections arranged at positions along the first direction in between the first end and the second end of the first mainstream grooves, the first mainstream grooves being in communication with the first communication grooves at the plurality of first intersections,
the second groove assembly includes a plurality of second mainstream grooves that extend in the first direction and a plurality of second communication grooves that extend in a direction different from the first direction and that communicate with one or more of the second mainstream grooves,
the second mainstream grooves each continuously extend from a first end to a second end along the first direction, and the second mainstream grooves are each intersected by the second communication grooves at a plurality of second intersections arranged at positions along the first direction in between the first end and the second end of the second mainstream grooves, the second mainstream grooves being in communication with the second communication grooves at the plurality of second intersections,
a flow channel cross-sectional area of a second mainstream groove of the plurality of second mainstream grooves is greater than a flow channel cross-sectional area of a first mainstream groove of the plurality of first mainstream grooves, and
a flow channel cross-sectional area of a second communication groove of the plurality of second communication grooves is greater than a flow channel cross-sectional area of a first communication groove of the plurality of first communication grooves.

28. The wick sheet according to claim 27, wherein:
a first group of the first communication grooves interconnect two neighboring first mainstream grooves, and a second group of the first communication grooves connect the penetration space to one of the first mainstream grooves; and
a first group of the second communication grooves interconnect two neighboring second mainstream grooves, and a second group of the second communication grooves connect the penetration space to one of the second mainstream grooves.

29. The wick sheet according to claim 27, wherein the first mainstream grooves extend in both directions along the first direction beyond the first intersections at which the first communication grooves intersect the first mainstream grooves.

* * * * *